United States Patent
Chern

(10) Patent No.: US 11,315,937 B2
(45) Date of Patent: Apr. 26, 2022

(54) 1.5-TRANSISTOR (1.5T) ONE TIME PROGRAMMABLE (OTP) MEMORY WITH THIN GATE TO DRAIN DIELECTRIC AND METHODS THEREOF

(71) Applicant: HeFeChip Corporation Limited, Hong Kong (HK)

(72) Inventor: Geeng-Chuan Chern, Cupertino, CA (US)

(73) Assignee: HeFeChip Corporation Limited, Sai Ying Pun (HK)

( * ) Notice: Subject to any disclaimer, the term of this patent is extended or adjusted under 35 U.S.C. 154(b) by 0 days.

(21) Appl. No.: 16/997,168

(22) Filed: Aug. 19, 2020

(65) Prior Publication Data
US 2022/0059551 A1    Feb. 24, 2022

(51) Int. Cl.
| | |
|---|---|
| *G11C 16/04* | (2006.01) |
| *H01L 27/112* | (2006.01) |
| *H01L 29/423* | (2006.01) |
| *H01L 29/40* | (2006.01) |
| *G11C 17/18* | (2006.01) |
| *G11C 17/16* | (2006.01) |

(52) U.S. Cl.
CPC ........ *H01L 27/11206* (2013.01); *G11C 17/16* (2013.01); *G11C 17/18* (2013.01); *H01L 29/401* (2013.01); *H01L 29/42368* (2013.01)

(58) Field of Classification Search
CPC ... G11C 17/16; G11C 17/18; H01L 27/11206; H01L 29/401; H01L 29/42368
See application file for complete search history.

(56) References Cited

U.S. PATENT DOCUMENTS

| | | | |
|---|---|---|---|
| 4,507,757 A | 3/1985 | McElroy | |
| 11,074,985 B1 * | 7/2021 | Chern | G11C 17/16 |
| 11,114,140 B1 * | 9/2021 | Chern | G11C 16/30 |
| 2020/0091285 A1 * | 3/2020 | Hafez | H01L 29/0638 |

OTHER PUBLICATIONS

Wlodek Kurjanowicz "1T OTP Memory: Delivering Quality and Reliability" https://www.chipestimate.com/1T-OTP-Memory-Delivering-Quality-and-Reliability/Sidense-a-part-of-Synopsys/Technical-Article/2007/12/18; Retreived from internet Aug. 18, 2020; pp. 5.

* cited by examiner

*Primary Examiner* — Pho M Luu
(74) *Attorney, Agent, or Firm* — Allen, Dyer, Doppelt + Gilchrist, PA

(57) ABSTRACT

A semiconductor device and methods thereof are disclosed. The proposed semiconductor device includes at least a unit cell wherein the unit cell includes a select transistor, and half of a ground-gate transistor electrically connected to the select transistor, and including a central conductive gate electrode region, two side conductive spacer regions and a gate dielectric layer, wherein a first and a second thicknesses of the gate dielectric layer underneath the two side conductive spacer regions are thinner than a third thickness of the gate dielectric layer underneath the central conductive gate electrode region.

20 Claims, 23 Drawing Sheets

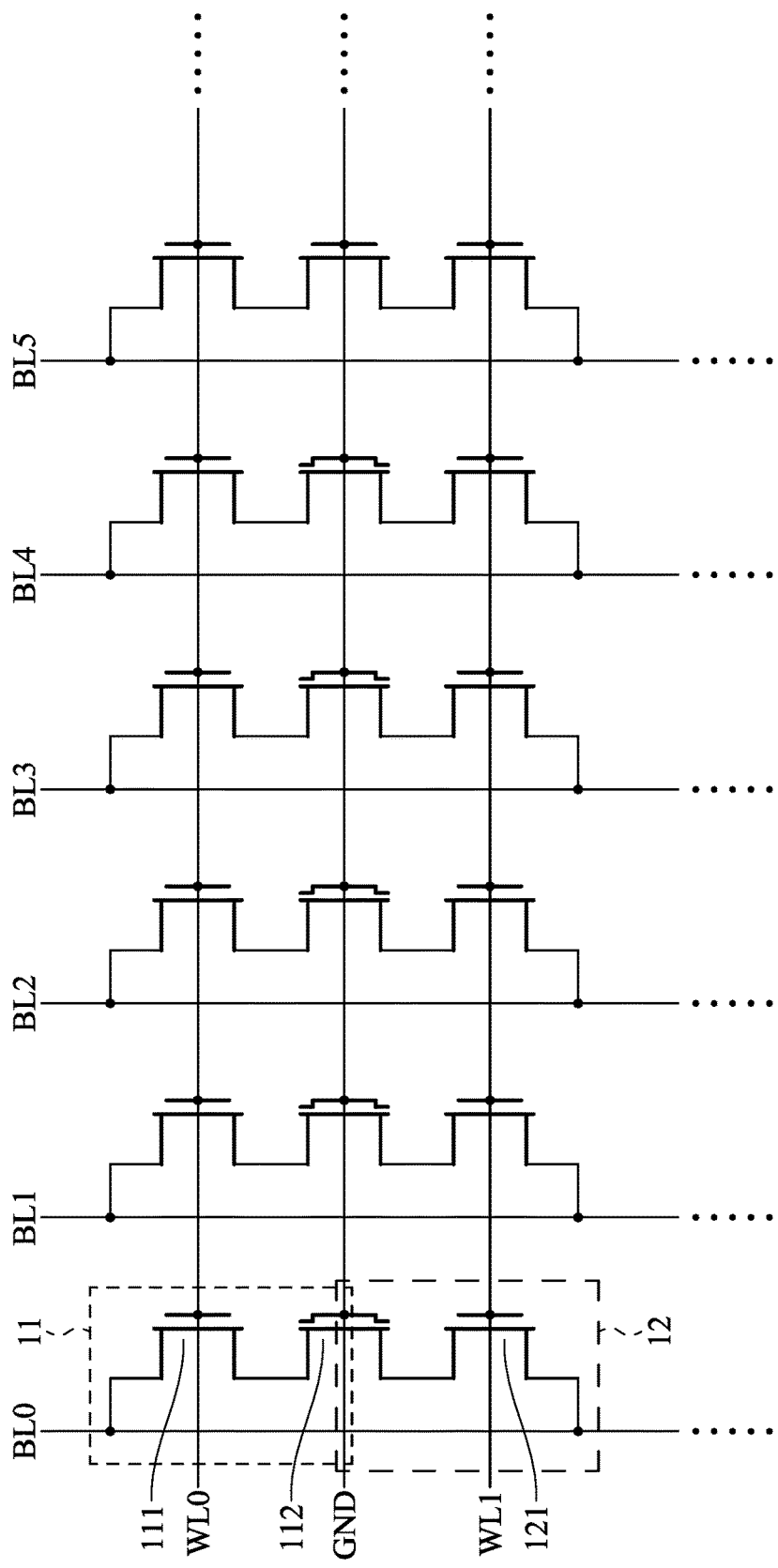

US 11,315,937 B2

1.5-TRANSISTOR (1.5T) ONE TIME PROGRAMMABLE (OTP) MEMORY WITH THIN GATE TO DRAIN DIELECTRIC AND METHODS THEREOF

FIELD OF THE INVENTION

The present invention relates to a one time programmable (OTP) memory and methods thereof, in particular to a 1.5-transistor (1.5T) OTP memory with thin gate to drain dielectric and methods thereof.

BACKGROUND OF THE INVENTION

Many different One Time Programmable (OTP) memories were disclosed by the prior arts. Most of these OTP memories utilize oxide rupture or anti-fuse mechanism to program the memory cells. To cause oxide rupture, a voltage higher than that of the oxide breakdown is usually applied across the oxide in the area to be programmed for a period of time long enough to ensure hard oxide breakdown. Additional switch transistors are required to select a programmable element from an array of memory cells for programming and reading. An example is shown in U.S. patent application Ser. No. 16/856,055, which disclosed a 3-transistor (3T) OTP memory.

Another example is given in U.S. Pat. No. 4,507,757, which disclosed an OTP memory with a reduced number of transistors in a unit cell. It utilized reverse gated P-N junction avalanche breakdown to create a large amount of electron-hole pairs, resulting in bipolar second breakdown that eventually caused dielectric breakdown. For example, the programming voltage chosen was 60% of the 35V oxide breakdown strength.

Though the OTP memory shown in U.S. Pat. No. 4,507,757 has the advantage that lower than oxide breakdown voltage can cause oxide rupture for programming, it has the disadvantages that the cell layout is quite complicated, and relatively high avalanche breakdown current is required for bipolar second breakdown to cause oxide rupture.

FIG. 1(a) shows a circuit diagram of a classic 1.5T anti-fuse cell in the prior art. FIG. 1(b) shows a cross-sectional view of the classic 1.5T anti-fuse cell as shown in FIG. 1(a). This 1.5T bit cell can experience oxide breakdown (program) in three different regions, resulting in a multi-modal distribution of programmed cell current with tail bits compromising programmability and reliability (see "1T OTP Memory: Delivering Quality and Reliability", by Wlodek Kurjanowicz, Founder and CTO, Sidense).

Thus, how to improve a 1.5-Transistor (1.5T) OTP memory with simpler layout and low oxide rupture programming current are important aspects for development in the field.

Keeping the drawbacks of the prior art in mind, and through the use of robust and persistent experiments and research, the applicant has finally conceived of a 1.5-transistor (1.5T) one time programmable (OTP) memory with thin gate to drain dielectric and methods thereof.

SUMMARY OF THE INVENTION

It is therefore an objective of the present invention to provide a 1.5-Transistor (1.5T) OTP memory with simpler layout and low oxide rupture programming current.

In accordance with the first aspect of the present invention, a method of manufacturing a semiconductor device comprises: (a) forming a gate dielectric layer on top of a substrate or a well; (b) forming a first conductive layer on the gate dielectric layer; (c) defining word line and ground poly line areas on the first conductive layer; (d) removing the first conductive layer exposed by a first photoresist pattern and forming gate areas; (e) forming source and drain areas under the gate dielectric layer and around the corresponding gate areas, wherein the gate areas within the ground poly line areas define ground-gate areas; (f) partially removing the gate dielectric layer around the ground-gate areas; (g) forming a second conductive layer; and (h) removing a portion of the second conductive layer so as to leave poly spacers around the corresponding gate areas.

In accordance with the second aspect of the present invention, a semiconductor device having at least a unit cell wherein the unit cell comprises a select transistor, and half of a ground-gate transistor electrically connected to the select transistor, and having a central conductive gate electrode region, two side conductive spacer regions and a gate dielectric layer, wherein a first and a second thicknesses of the gate dielectric layer underneath the two side conductive spacer regions are thinner than a third thickness of the gate dielectric layer underneath the central conductive gate electrode region.

BRIEF DESCRIPTION OF THE DRAWINGS

Other objectives, advantages and efficacies of the present invention will be described in detail below taken from the preferred embodiments with reference to the accompanying drawings, in which:

FIG. 2(a) is a circuit diagram of a memory array according to the first preferred embodiment of the present invention.

Figure 7A:
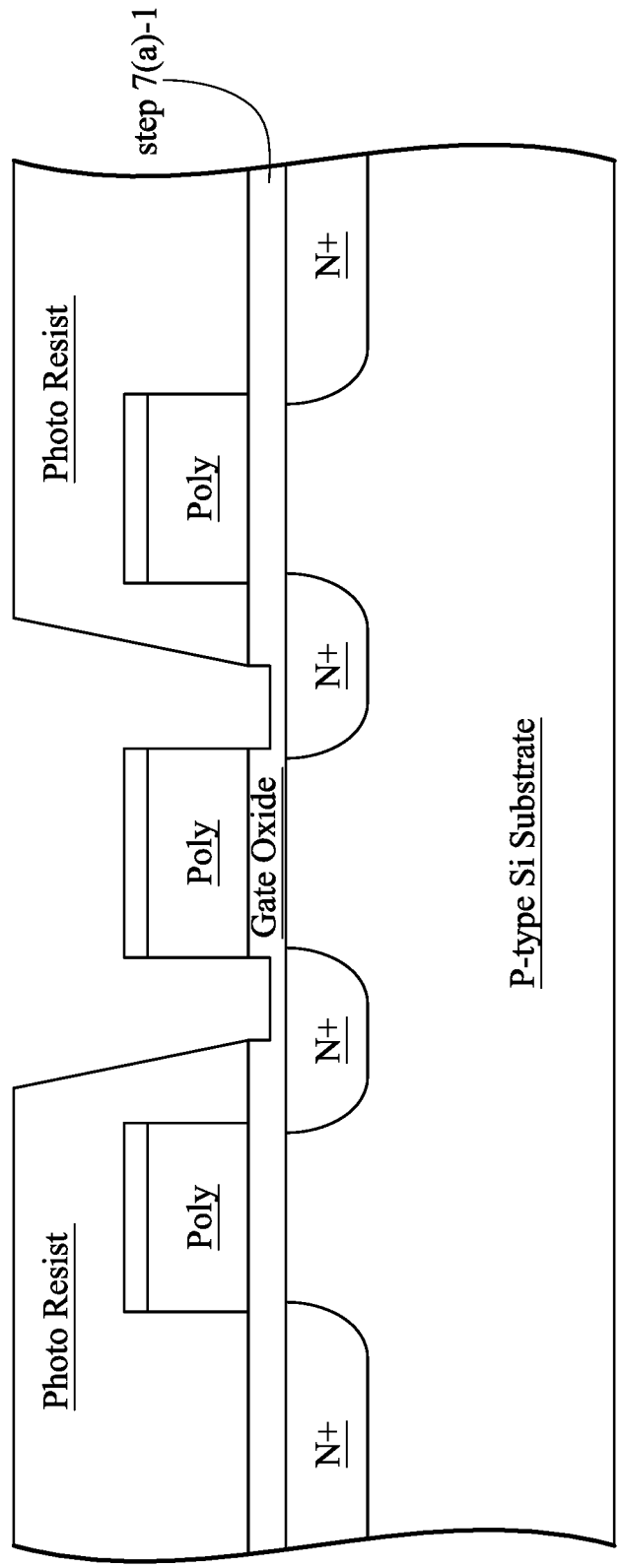

FIG. 7(a) is a cross-sectional view along AA' direction of a memory array in FIG. 2(a) corresponding to a step 7(a)-1 of a manufacturing process according to the first preferred embodiment of the present invention.

Figure 1A:
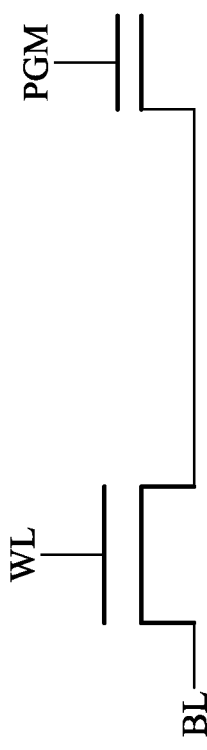
FIG. 1(a) is a circuit diagram of a classic 1.5T anti-fuse cell in the prior art.
Figure 1B:
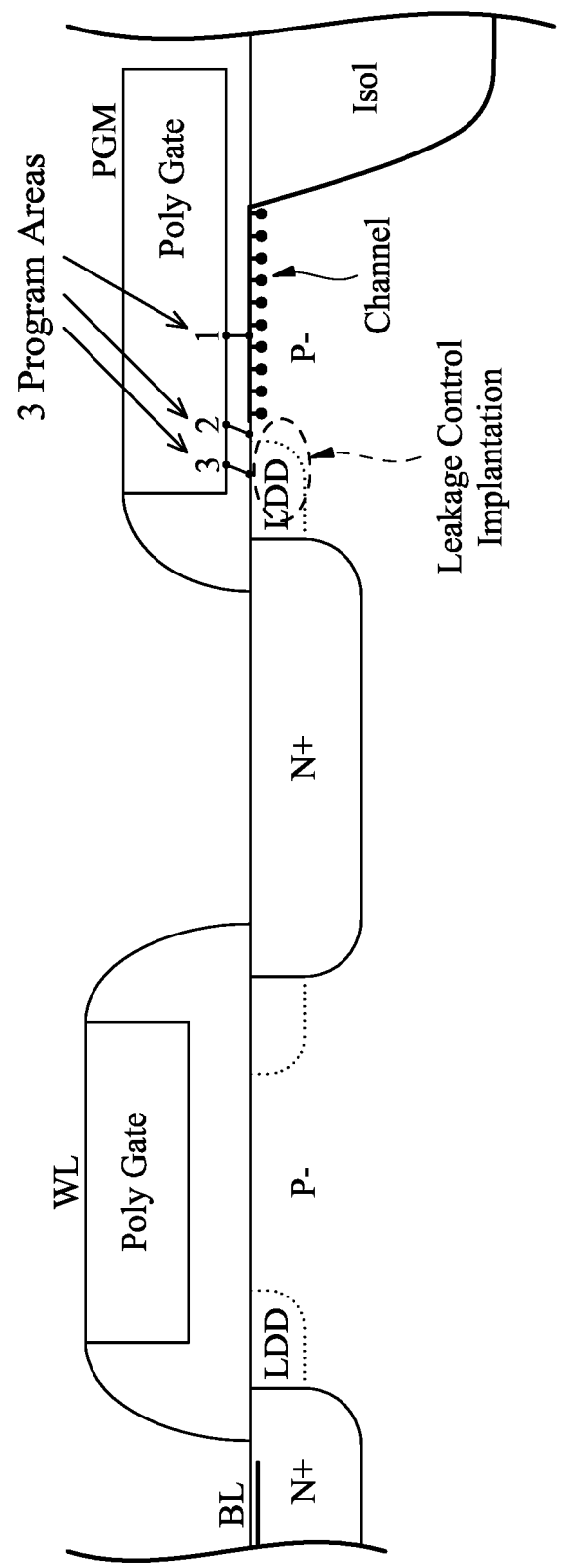
FIG. 1(b) is a cross-sectional view of the classic 1.5T anti-fuse cell as shown in FIG. 1(a).
Figure 2B:
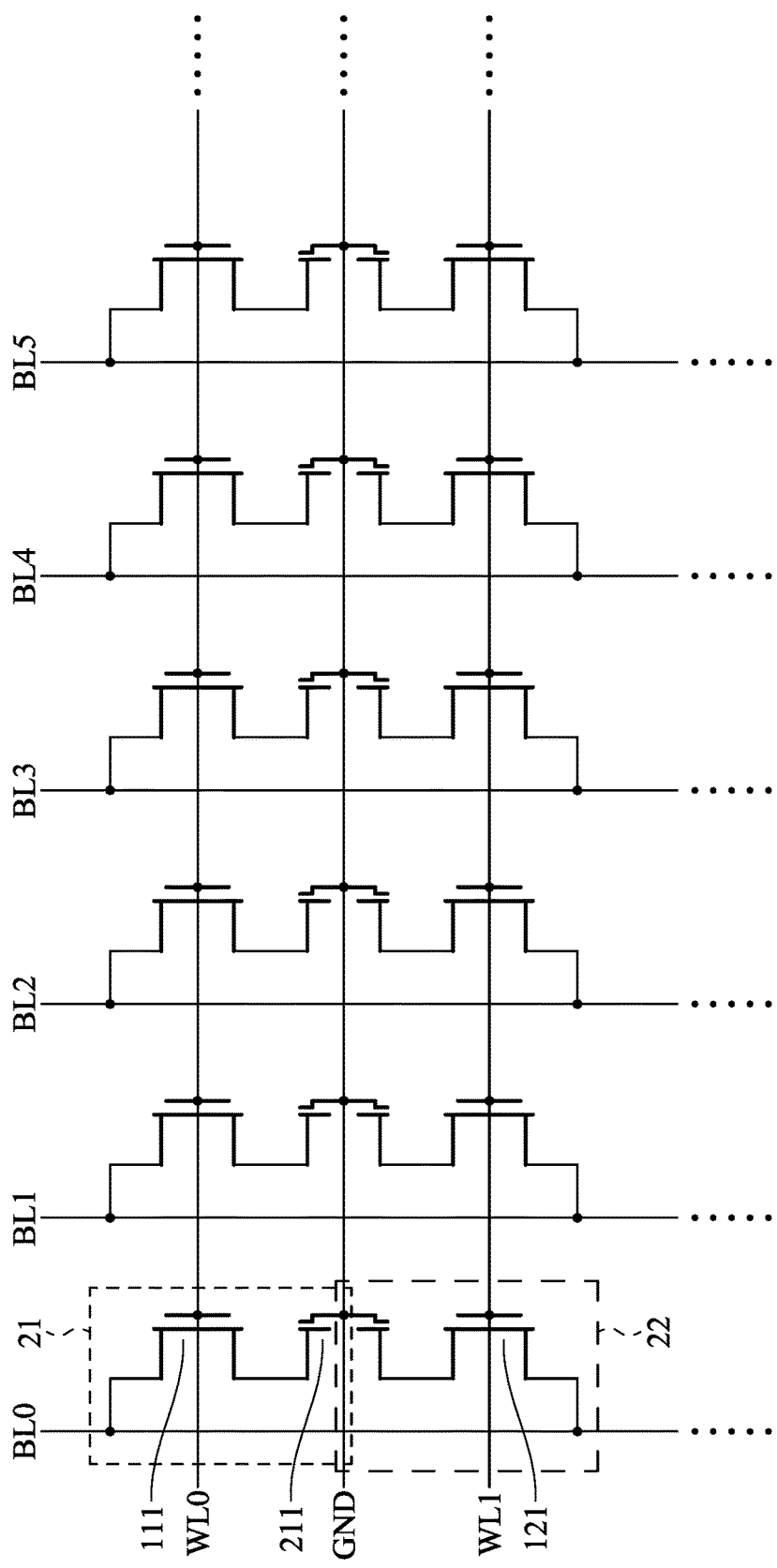
FIG. 2(b) is a circuit diagram of a memory array according to the second preferred embodiment of the present invention.
Figure 7B:
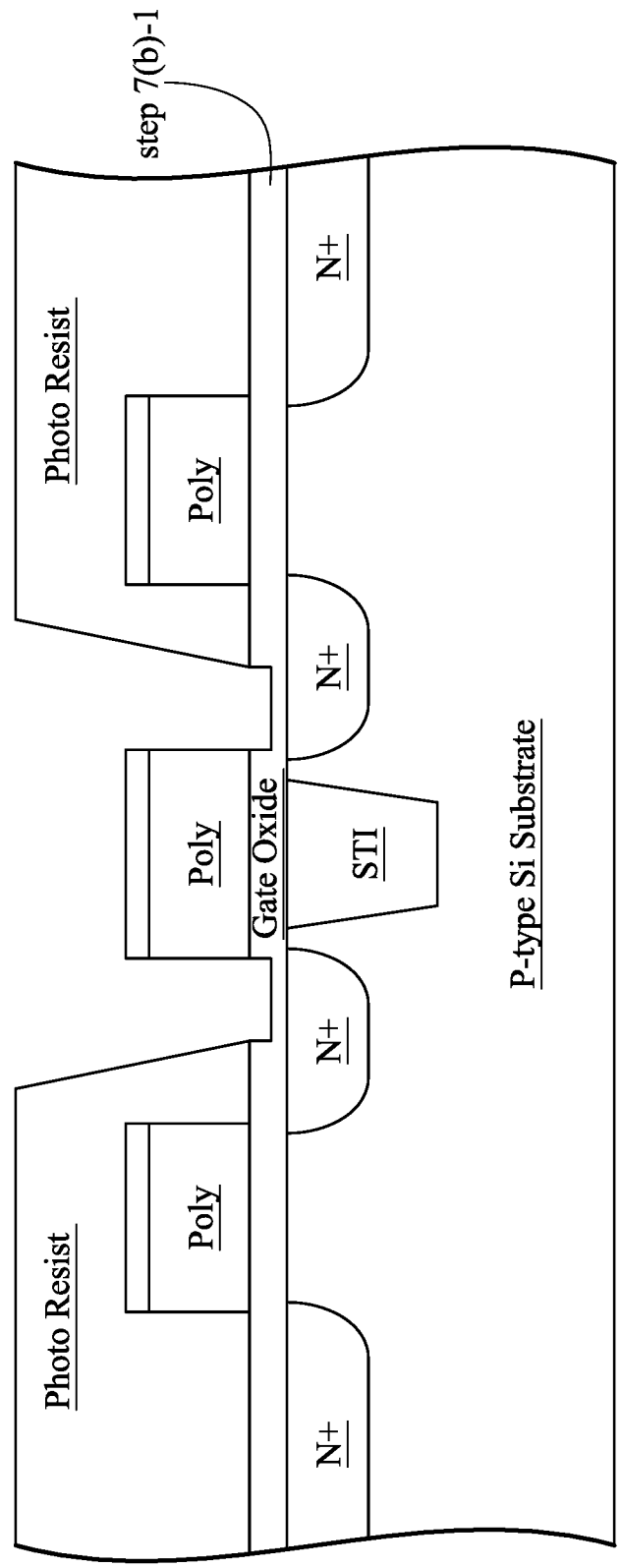

FIG. 7(b) is a cross-sectional view along AA' direction of a memory array in FIG. 2(b) corresponding to a step 7(b)-1 of a manufacturing process according to the second preferred embodiment of the present invention.

Figure 8A:
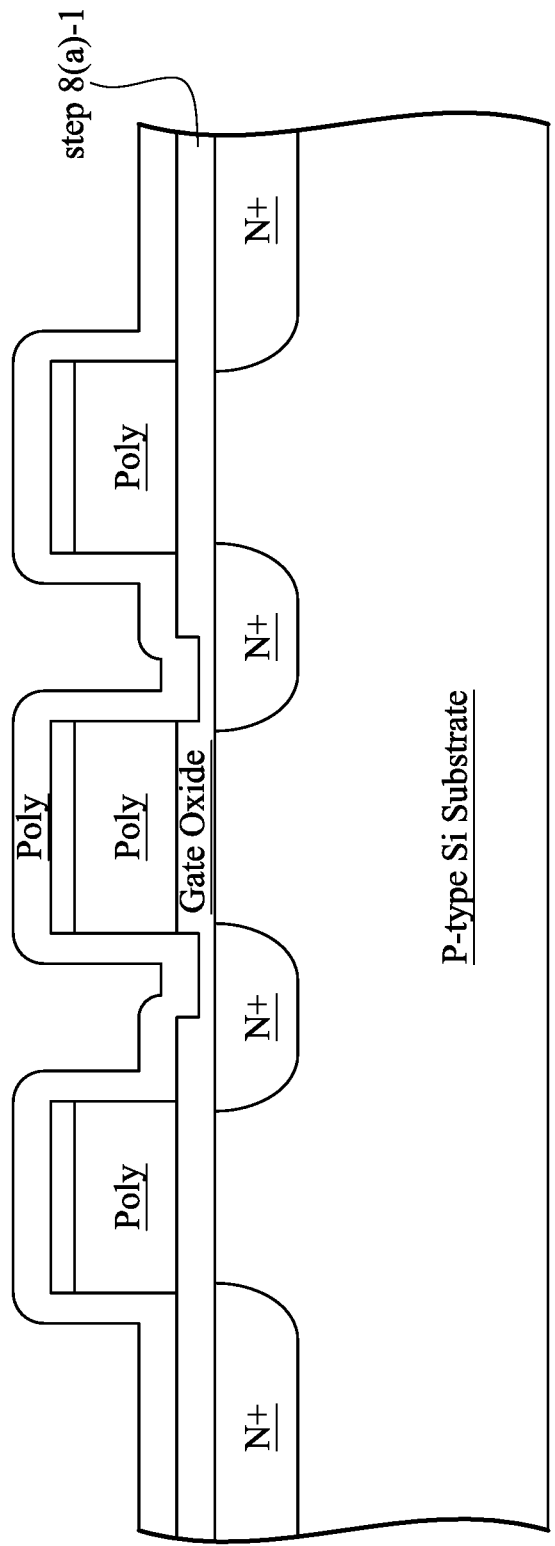

FIG. 8(a) is a cross-sectional view along AA' direction of a memory array in FIG. 2(a) corresponding to a step 8(a)-1 of a manufacturing process according to the first preferred embodiment of the present invention.

Figure 8B:
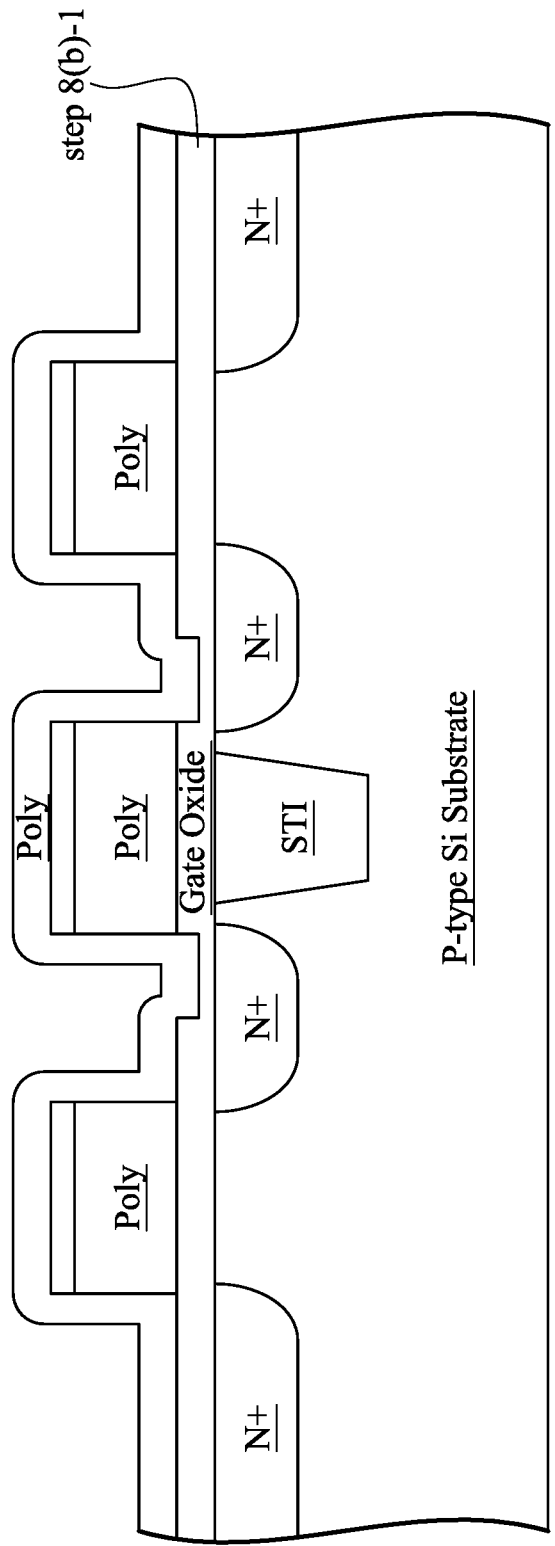

FIG. 8(b) is a cross-sectional view along AA' direction of a memory array in FIG. 2(b) corresponding to a step 8(b)-1 of a manufacturing process according to the second preferred embodiment of the present invention.

Figure 9A:
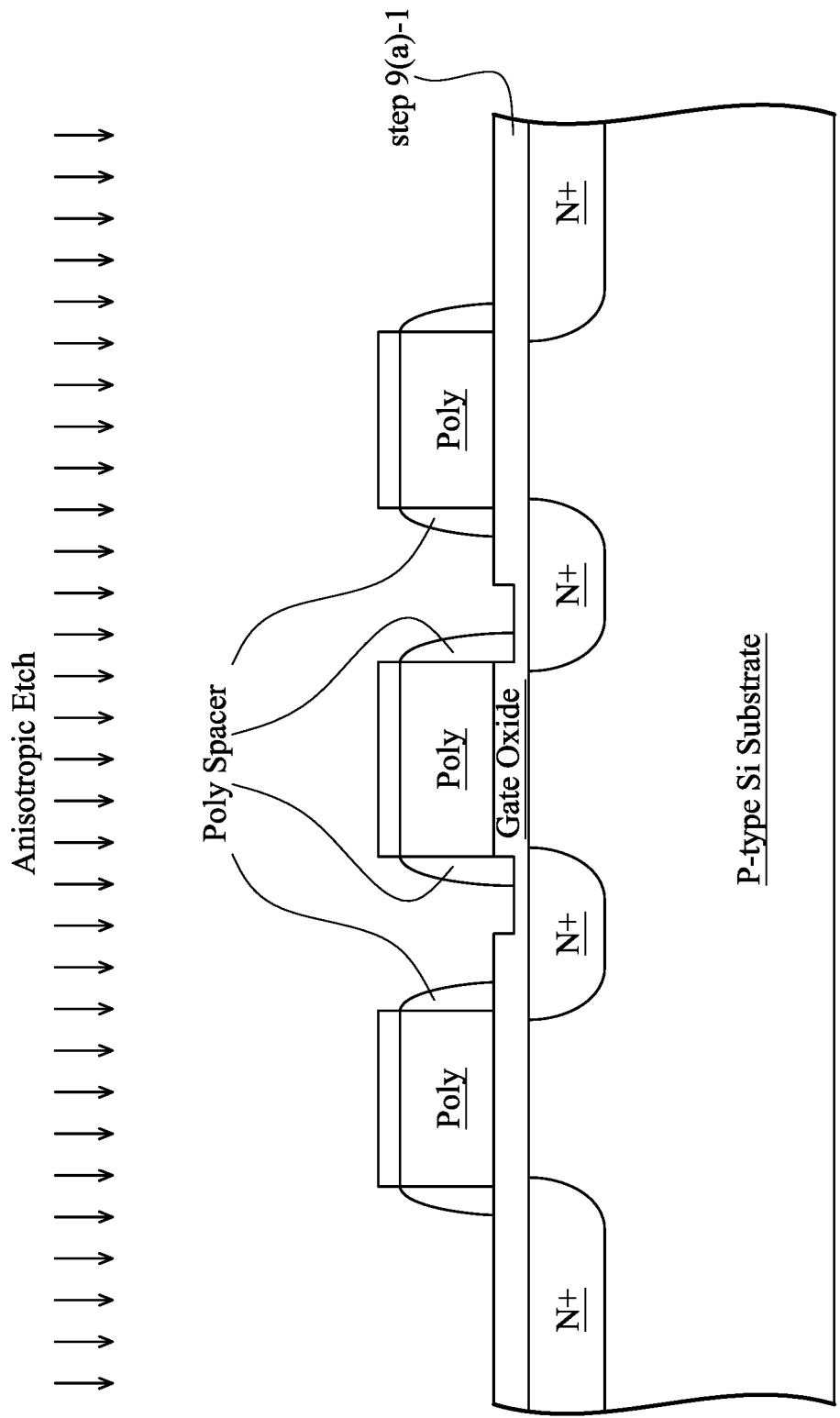

FIG. 9(a) is a cross-sectional view along AA' direction of a memory array in FIG. 2(a) corresponding to a step 9(a)-1 of a manufacturing process according to the first preferred embodiment of the present invention.

Figure 9B:
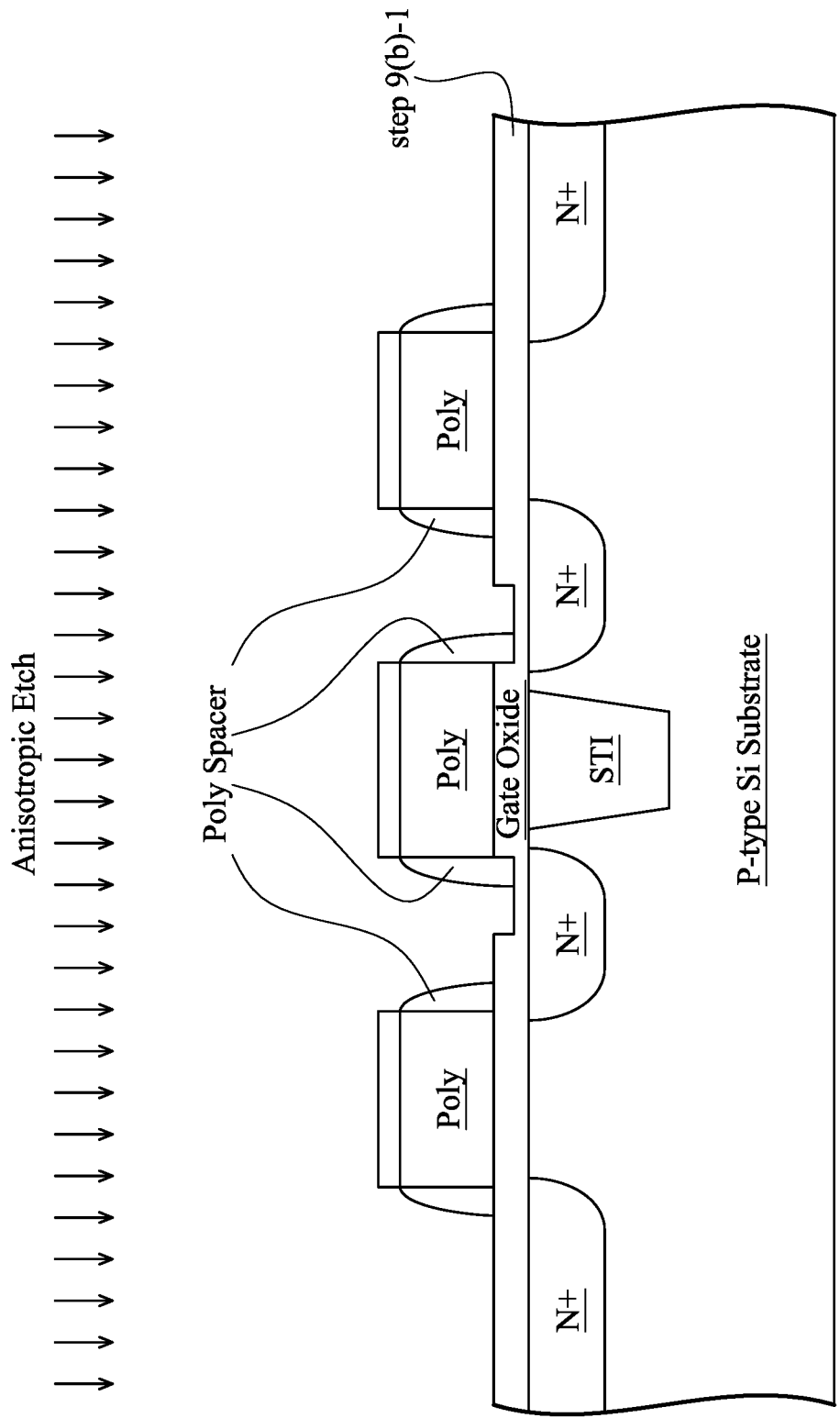

FIG. 9(b) is a cross-sectional view along AA' direction of a memory array in FIG. 2(b) corresponding to a step 9(b)-1 of a manufacturing process according to the second preferred embodiment of the present invention.

Figure 10A:
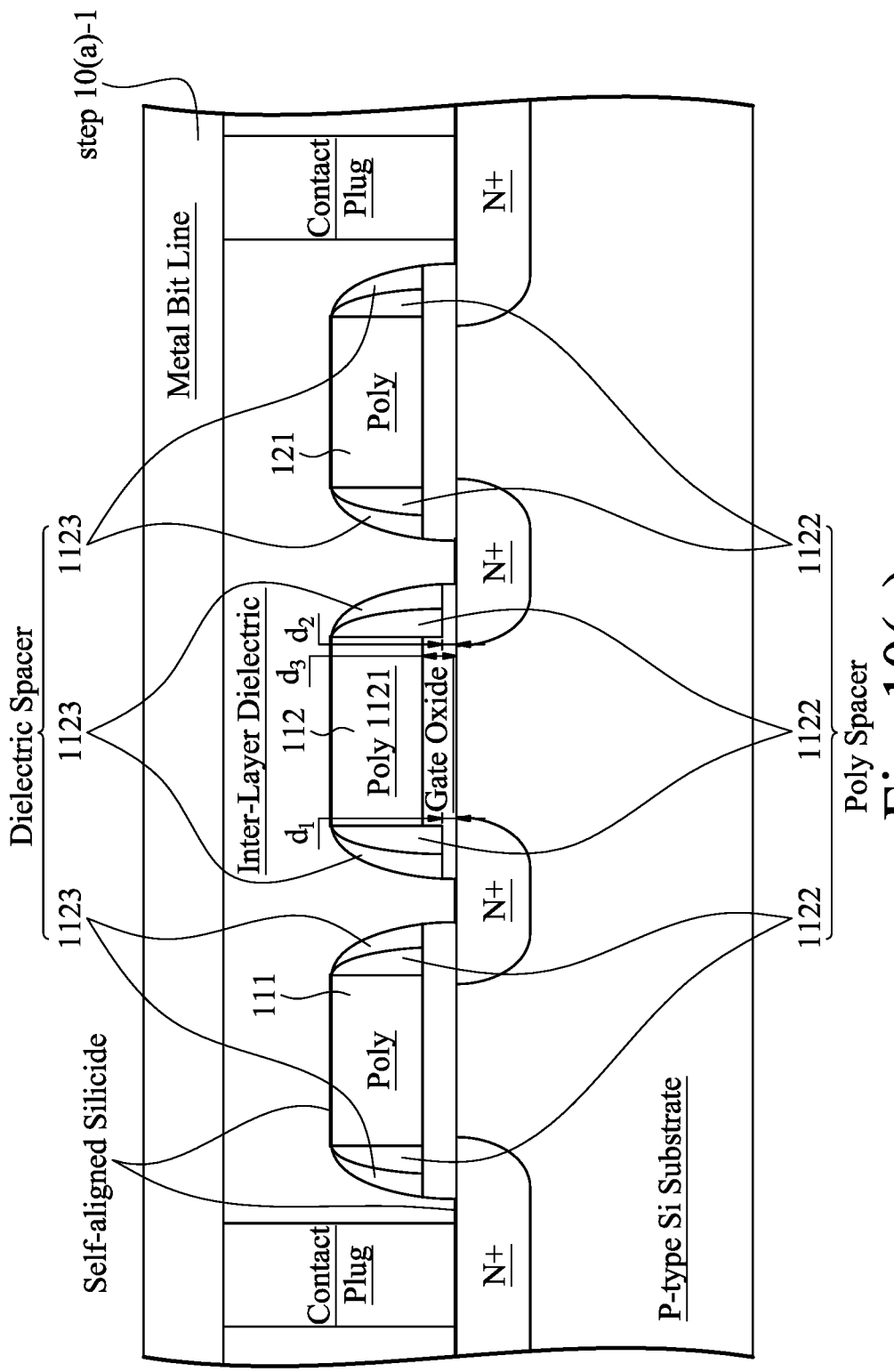

FIG. 10(a) is a cross-sectional view along AA' direction of a memory array in FIG. 2(a) corresponding to a step 10(a)-1 of a manufacturing process according to the first preferred embodiment of the present invention.

Figure 10B:
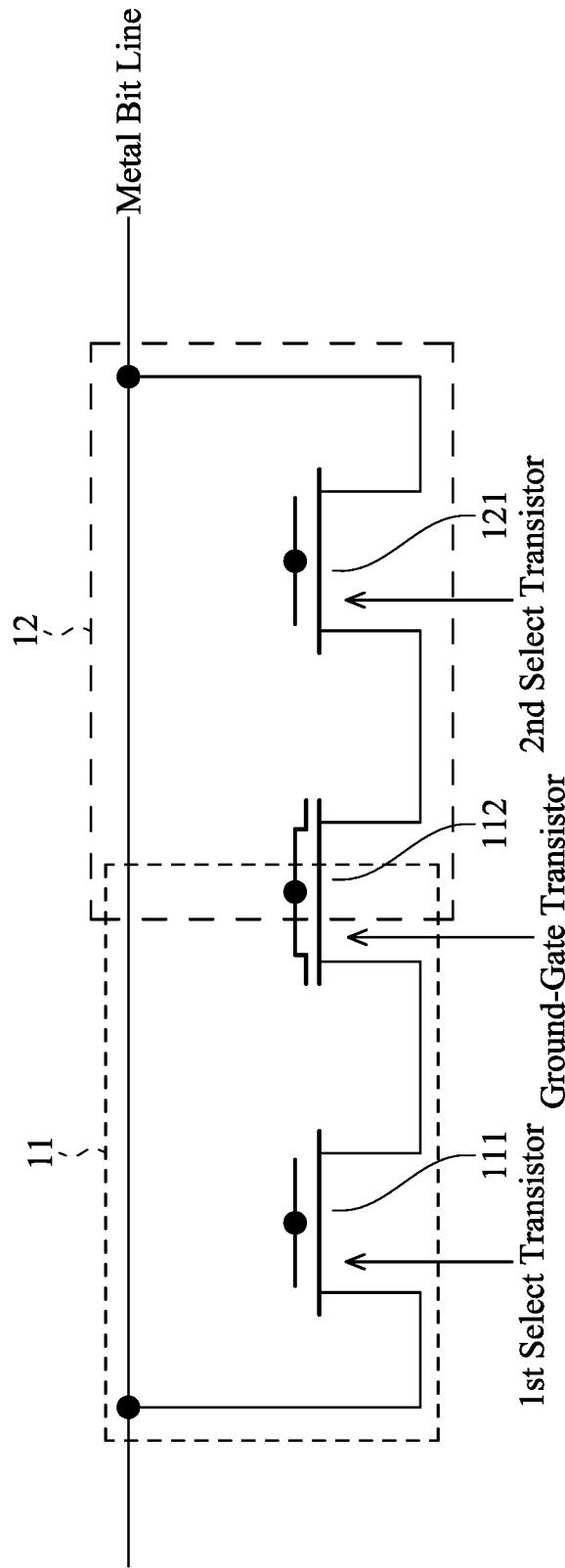

FIG. 10(b) is a circuit diagram of 2 memory cells with a ground-gate transistor as shown in FIG. 10(a).

Figure 10C:
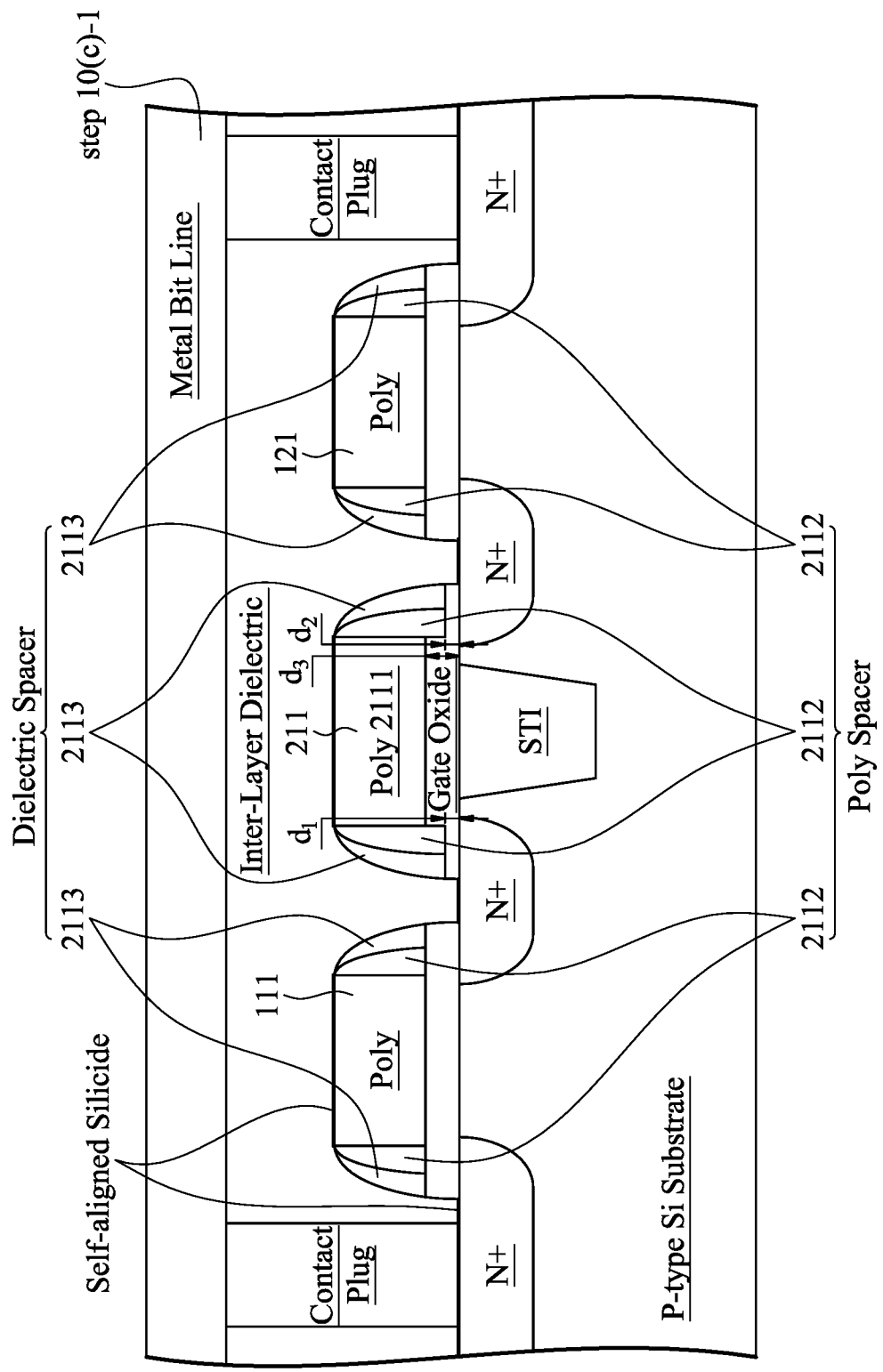

FIG. 10(c) is a cross-sectional view along AA' direction of a memory array in FIG. 2(b) corresponding to a step 10(c)-1 of a manufacturing process according to the second preferred embodiment of the present invention.

Figure 10D:
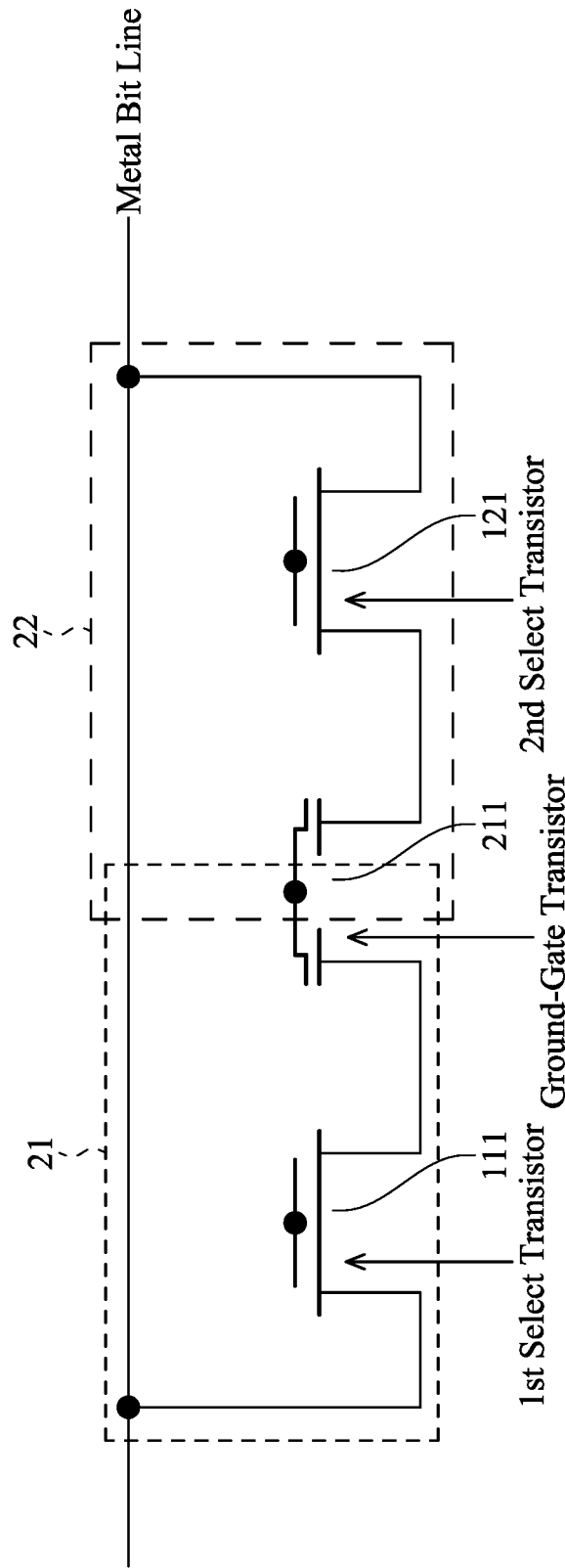

FIG. 10(d) is a circuit diagram of 2 memory cells with a ground-gate transistor as shown in FIG. 10(c).

Figure 11A:
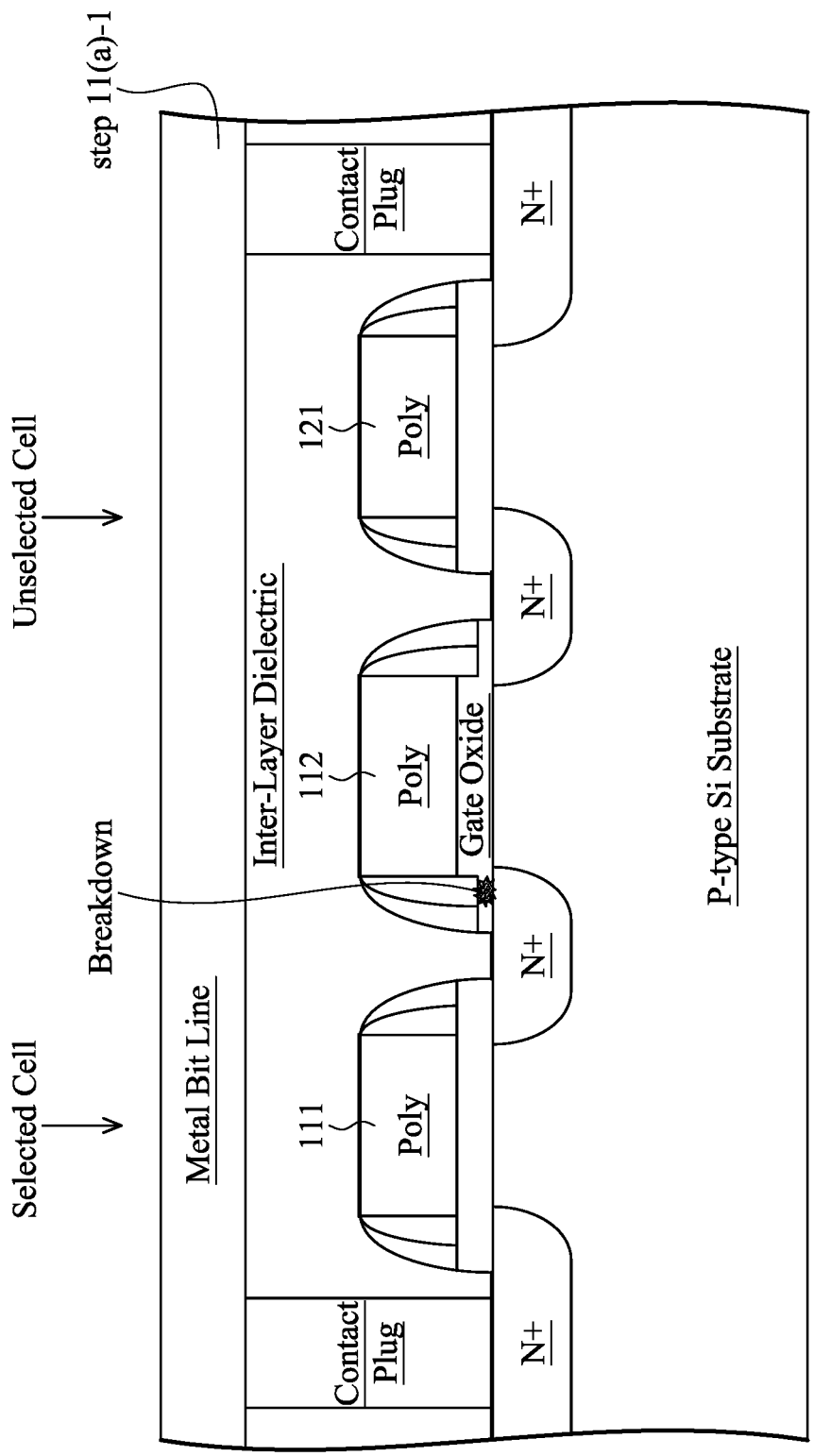

FIG. 11(a) is a cross-sectional view along AA' direction of a memory array in FIG. 2(a) corresponding to a step 11(a)-1 of a process to program a select cell according to the first preferred embodiment of the present invention.

Figure 11B:
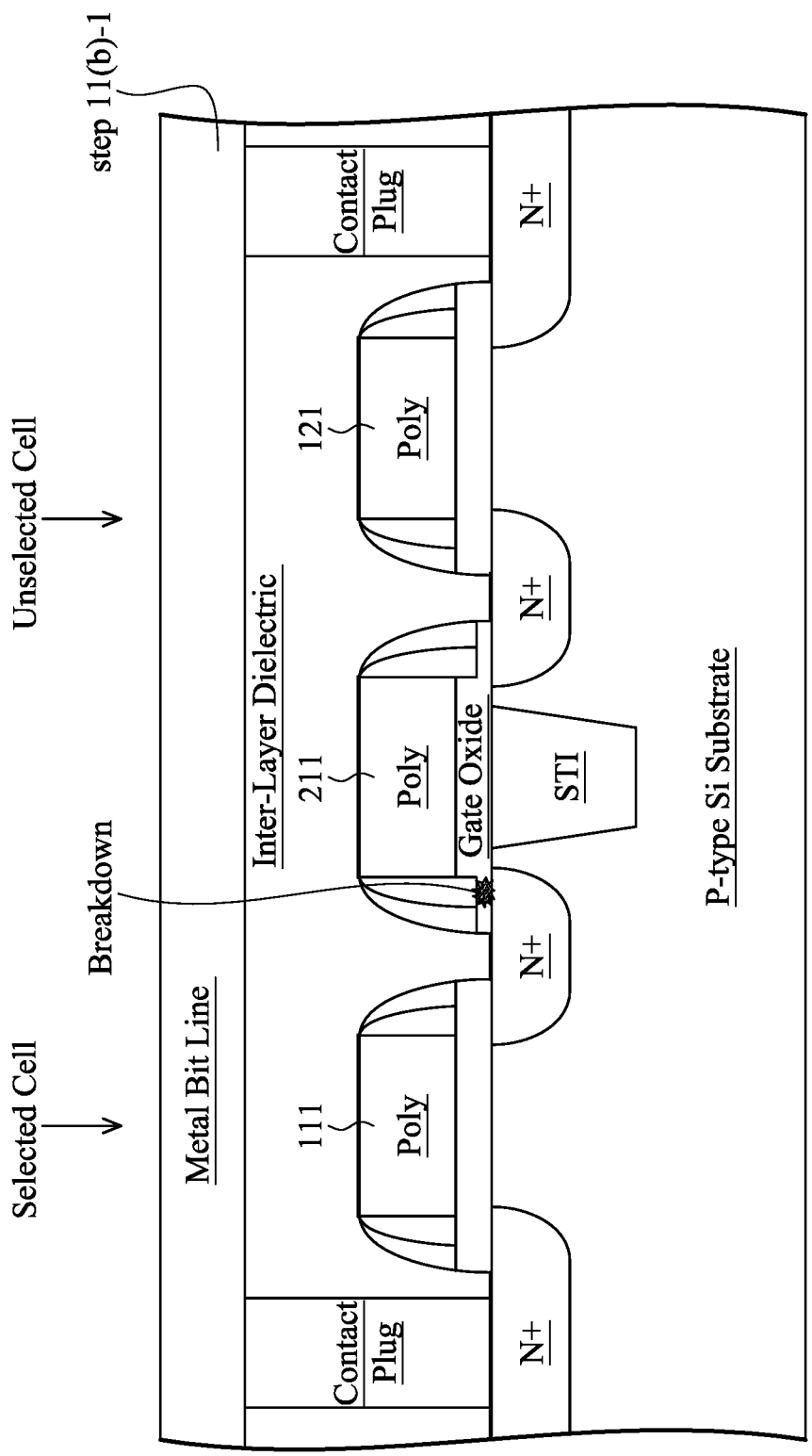

FIG. 11(b) is a cross-sectional view along AA' direction of a memory array in FIG. 2(b) corresponding to a step 11(b)-1 of a process to program a select cell according to the second preferred embodiment of the present invention.

DETAILED DESCRIPTION OF THE PREFERRED EMBODIMENT

The present invention will now be described more specifically with reference to the following embodiments. It is to be noted that the following descriptions of preferred embodiments of this invention are presented herein for purposes of illustration and description only; it is not intended to be exhaustive or to be limited to the precise form disclosed.

FIG. 2(a) shows a circuit diagram of a memory array according to the first preferred embodiment of the present invention. In FIG. 2(a), a memory array 1 of a 1.5-transistor (1.5T) one time programmable (OTP) memory with thin gate to drain dielectric is shown. As shown in FIG. 2(a), this memory array 1 includes a first unit cell 11 and a mirrored second unit cell 12, wherein the first unit cell 11 has a first select transistor (or a select transistor) 111 and half of a gate-ground transistor 112, and the second unit cell 12 has half of the gate-ground transistor 112 and a second select transistor 121. Though cell 12 is arranged as a mirror image of cell 11 so that the two half gate-ground transistors can share the same gate, it's also possible to arrange cell 12 without mirror imaging cell 11. Similarly, there are other groups of first unit cell and second unit cell along other bit lines, where BL1, BL2 etc. are bit lines, WL1, WL2 etc. are word lines, and GND is a ground or 0V.

FIG. 2(b) shows a circuit diagram of a memory array according to the second preferred embodiment of the present invention. In FIG. 2(b), a memory array 2 of a 1.5-transistor (1.5T) one time programmable (OTP) memory with thin gate to drain dielectric is shown. As shown in FIG. 2(b), this memory array 2 includes a first unit cell 21 and a mirrored second unit cell 22, wherein the first unit cell 21 has a first select transistor 111 and a gate-ground transistor 211, and the second unit cell 22 has the gate-ground transistor 211 and a second select transistor 121. The only difference between the memory array 1 and the memory array 2 is that each gate-ground transistor 211 has a shallow trench isolation (STI) structure configured beneath a gate dielectric layer under a central conductive region (or a central conductive gate electrode region) and above the substrate or the well (see Gate Oxide and 2111 in FIG. 10(c)). Similarly, there are other groups of first unit cell and second unit cell along other bit lines, where BL1, BL2 etc. are bit lines, WL1, WL2 etc. are word lines, and GND is a ground or 0V.

Figure 3A:
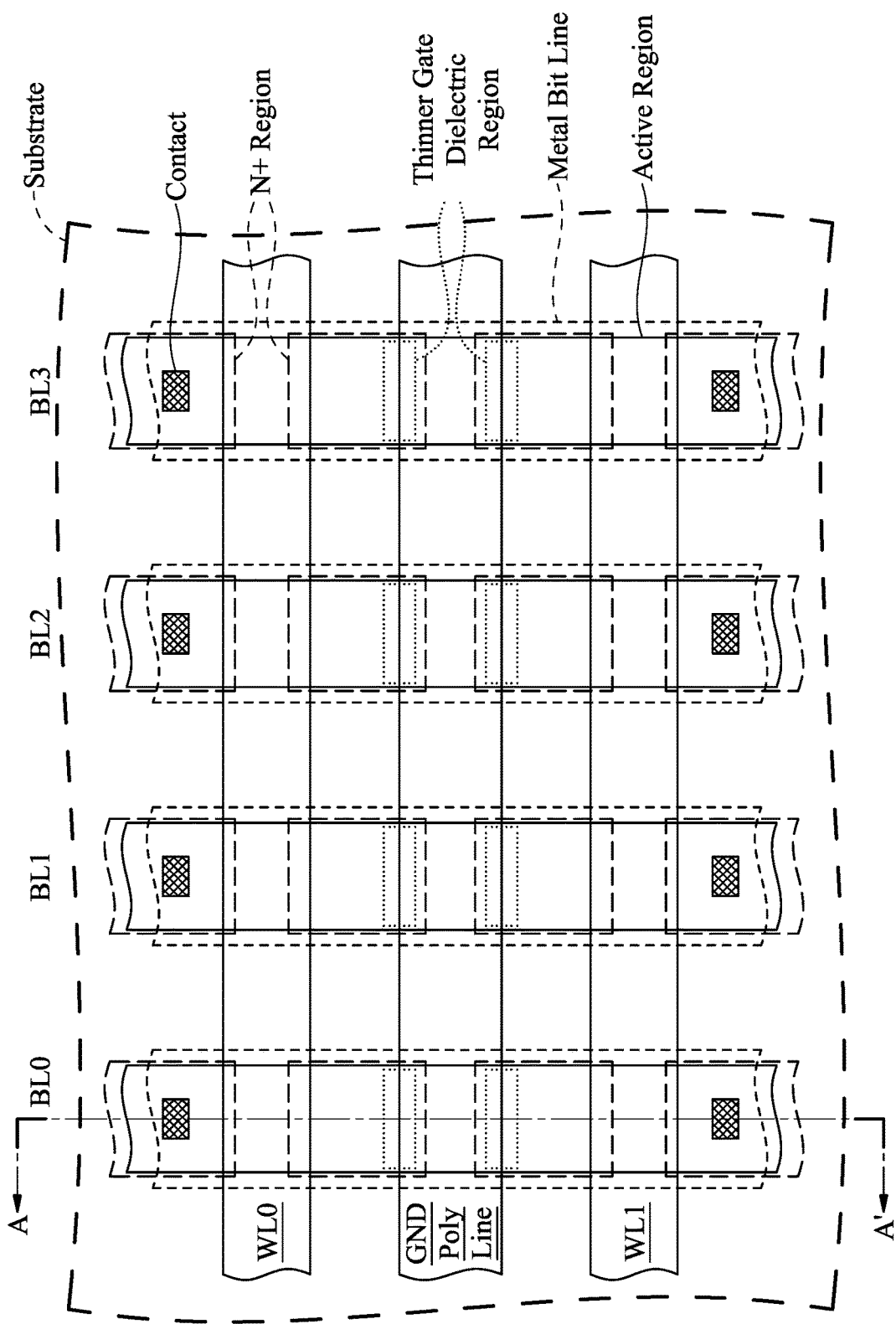
FIG. 3(a) is a top view of a memory array according to the first preferred embodiment of the present invention.

FIG. 3(a) shows a top view of a memory array according to the first preferred embodiment of the present invention. In FIG. 3(a), except for the word lines, the (metal) bit lines and the ground poly line, the memory array 1 also includes contacts, N+ regions, thinner gate dielectric regions, active regions and substrate.

Figure 3B:
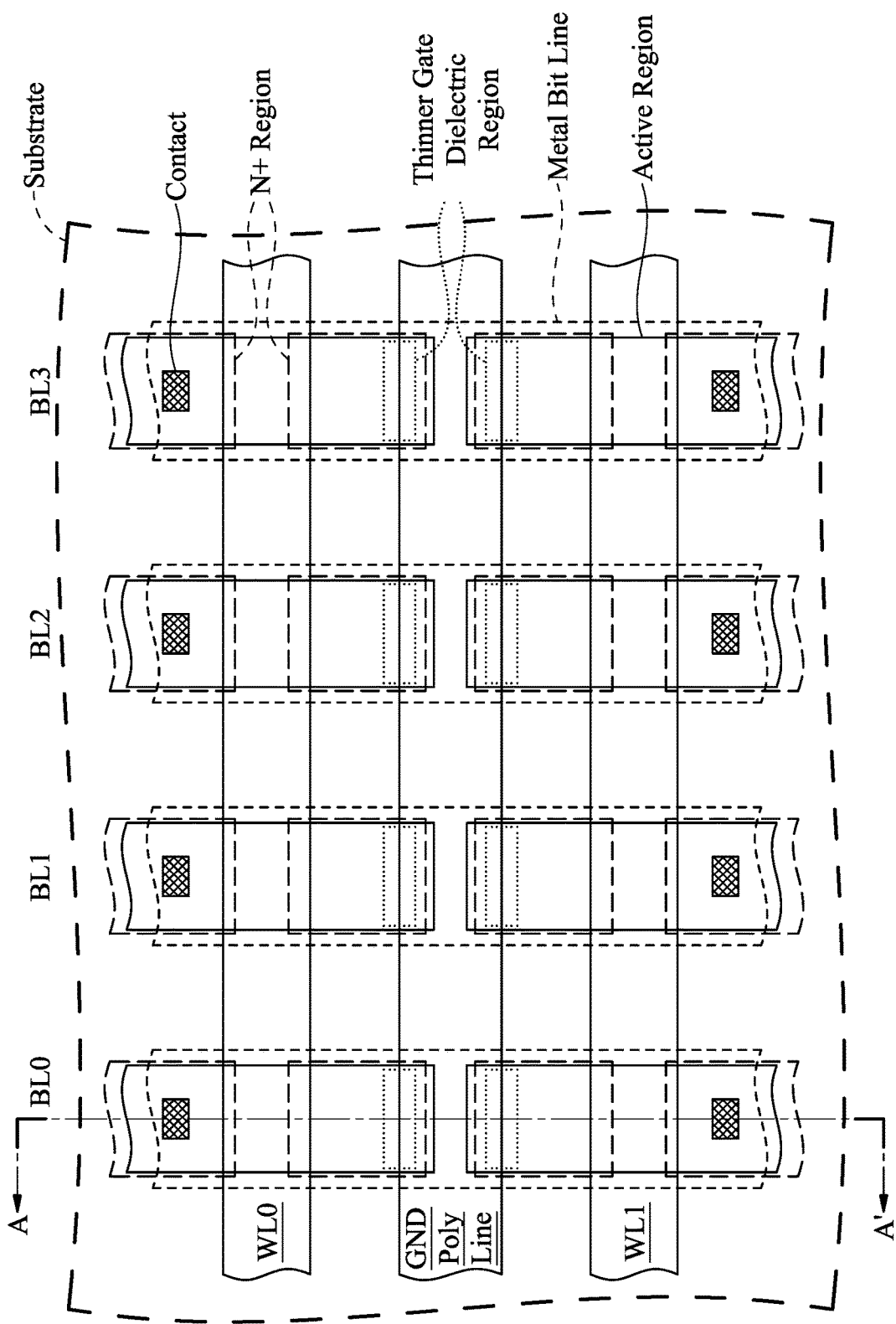
FIG. 3(b) is a top view of a memory array according to the second preferred embodiment of the present invention.

FIG. 3(b) shows a top view of a memory array according to the second preferred embodiment of the present invention. In FIG. 3(b), except for the word lines, the (metal) bit lines and the ground poly line, the memory array 2 also includes contacts, N+ regions, thinner gate dielectric regions, active regions and substrate.

Figure 4A:
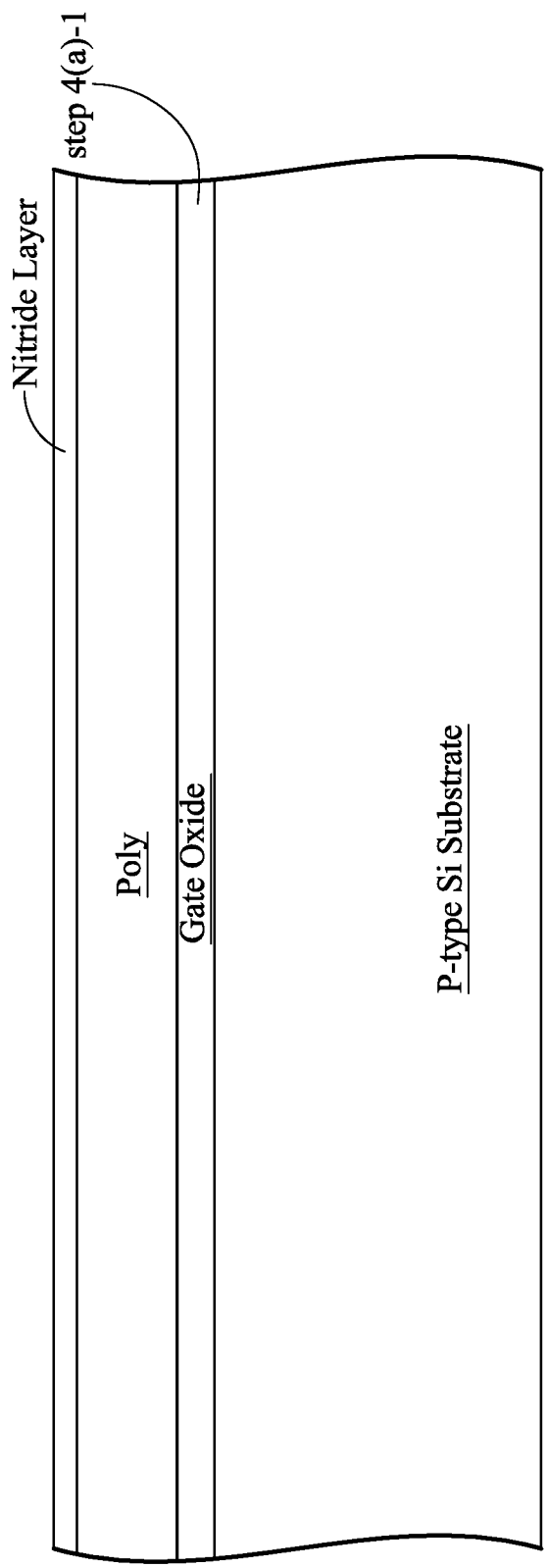
FIG. 4(a) is a cross-sectional view along AA' direction of a memory array in FIG. 2(a) corresponding to a step 4(a)-1 of a manufacturing process according to the first preferred embodiment of the present invention.

FIG. 4(a) shows a cross-sectional view along AA' direction of a memory array in FIG. 2(a) corresponding to a step 4(a)-1 of a manufacturing process according to the first preferred embodiment of the present invention. In the step 4(a)-1, it includes: (i) form a 2-20 nm gate dielectric layer (Gate Oxide), such as SiO2, SiON, HfO, etc. on top of a P-type substrate or well; (ii) use a 0-20 KeV energy, 1E12-1E13/cm$^2$ dose B or BF2 ion implantation for a threshold voltage (Vth) adjustment (optional, not shown); (iii) form the first conductive layer, such as N-doped poly-Si, silicide, metal, etc. (80-150 nm thick); (iv) form 5-10 nm thick cap nitride layer (optional).

Figure 4B:
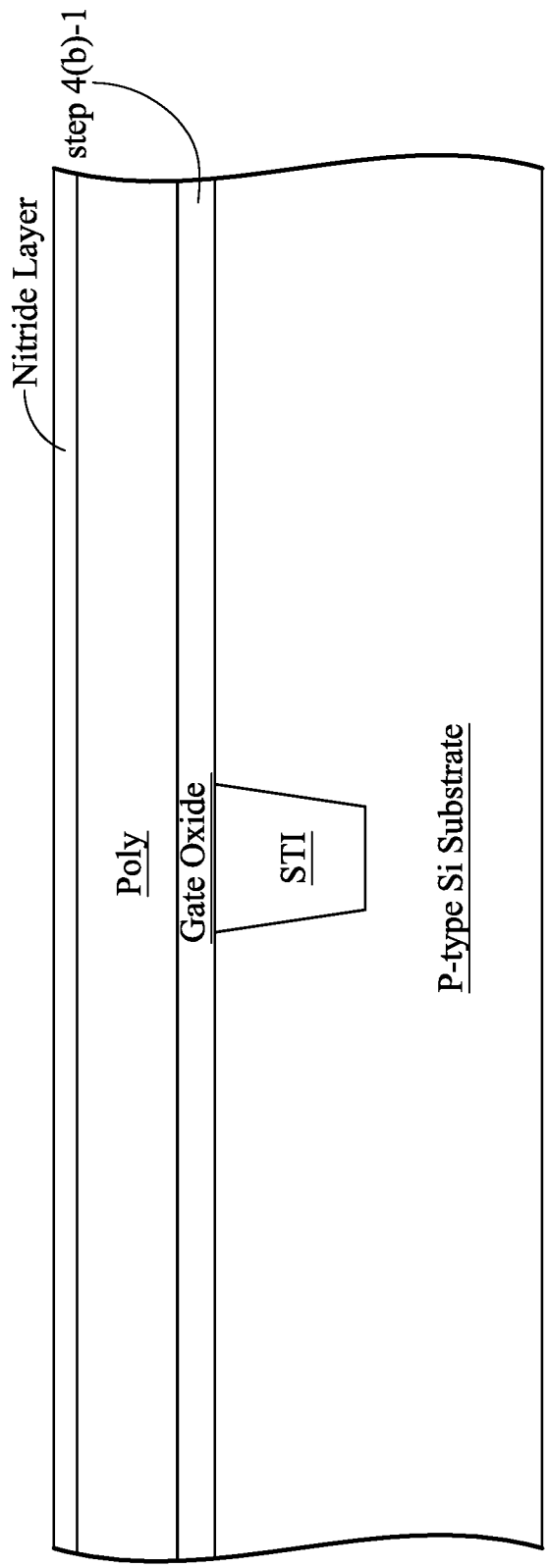
FIG. 4(b) is a cross-sectional view along AA' direction of a memory array in FIG. 2(b) corresponding to a step 4(b)-1 of a manufacturing process according to the second preferred embodiment of the present invention.

FIG. 4(b) shows a cross-sectional view along AA' direction of a memory array in FIG. 2(b) corresponding to a step 4(b)-1 of a manufacturing process according to the second preferred embodiment of the present invention. In the step 4(b)-1, it includes: (i) form active regions by Shallow Trench Isolation (STI) process (not shown); (ii) forma 2-20 nm gate dielectric layer (Gate Oxide), such as SiO2, SiON, HfO, etc. on top of a P-type substrate or well; (iii) use a 10-20 KeV energy, 1E12-1E13/cm$^2$ dose B or BF2 ion implantation for Vth adjustment (optional, not shown); (iv) form the first conductive layer, such as N-doped poly-Si, silicide, metal, etc. (80-150 nm thick); (v) form 5-10 nm thick cap nitride layer (optional).

Figure 5A:
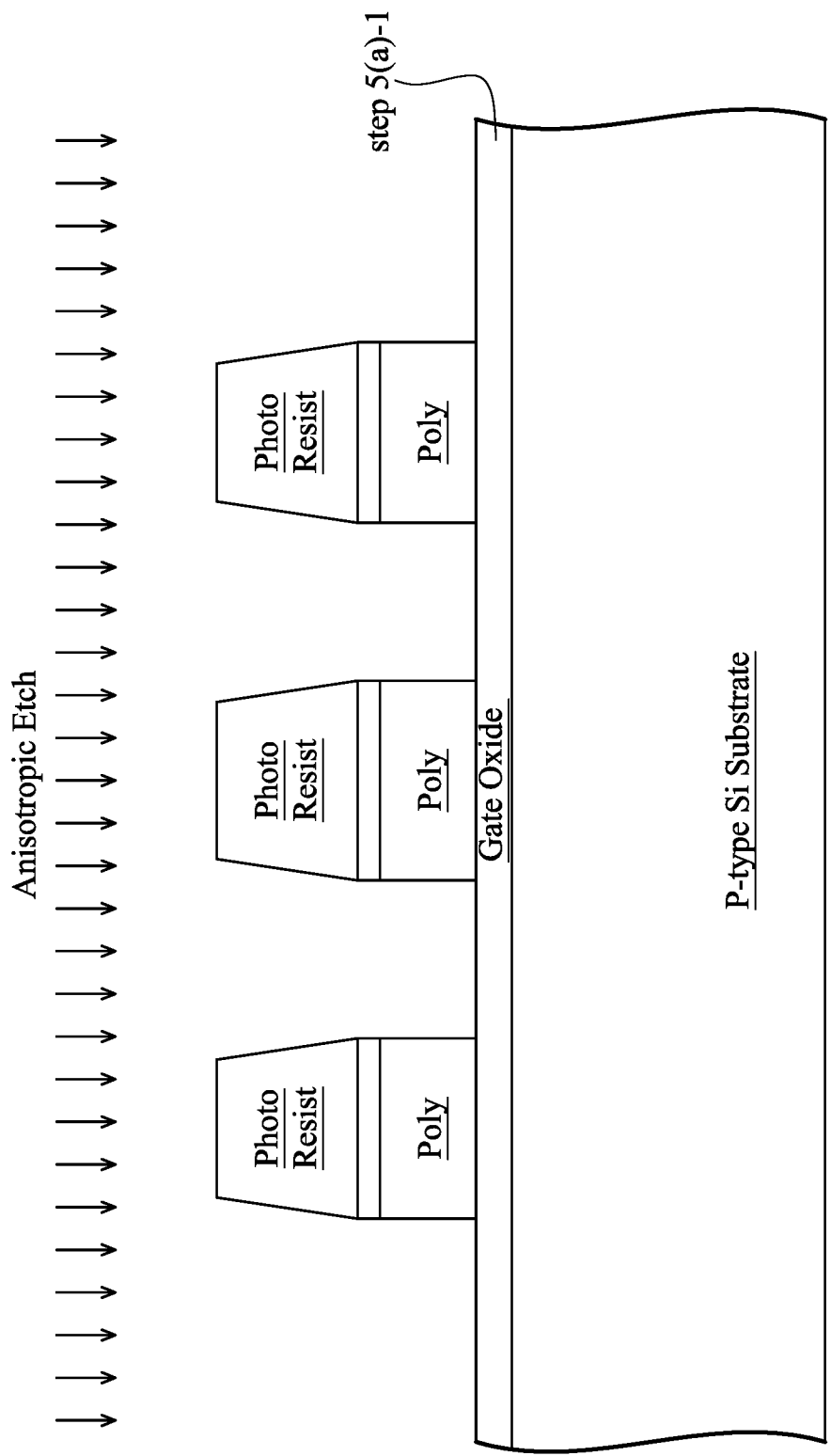
FIG. 5(a) is a cross-sectional view along AA' direction of a memory array in FIG. 2(a) corresponding to a step 5(a)-1 of a manufacturing process according to the first preferred embodiment of the present invention.

FIG. 5(a) shows a cross-sectional view along AA' direction of a memory array in FIG. 2(a) corresponding to a step 5(a)-1 of a manufacturing process according to the first preferred embodiment of the present invention. In the step 5(a)-1, it includes: (i) form a first photoresist pattern to define word line and ground poly line areas; (ii) use a first anisotropic etch to remove exposed nitride and conductive gate material.

Figure 5B:
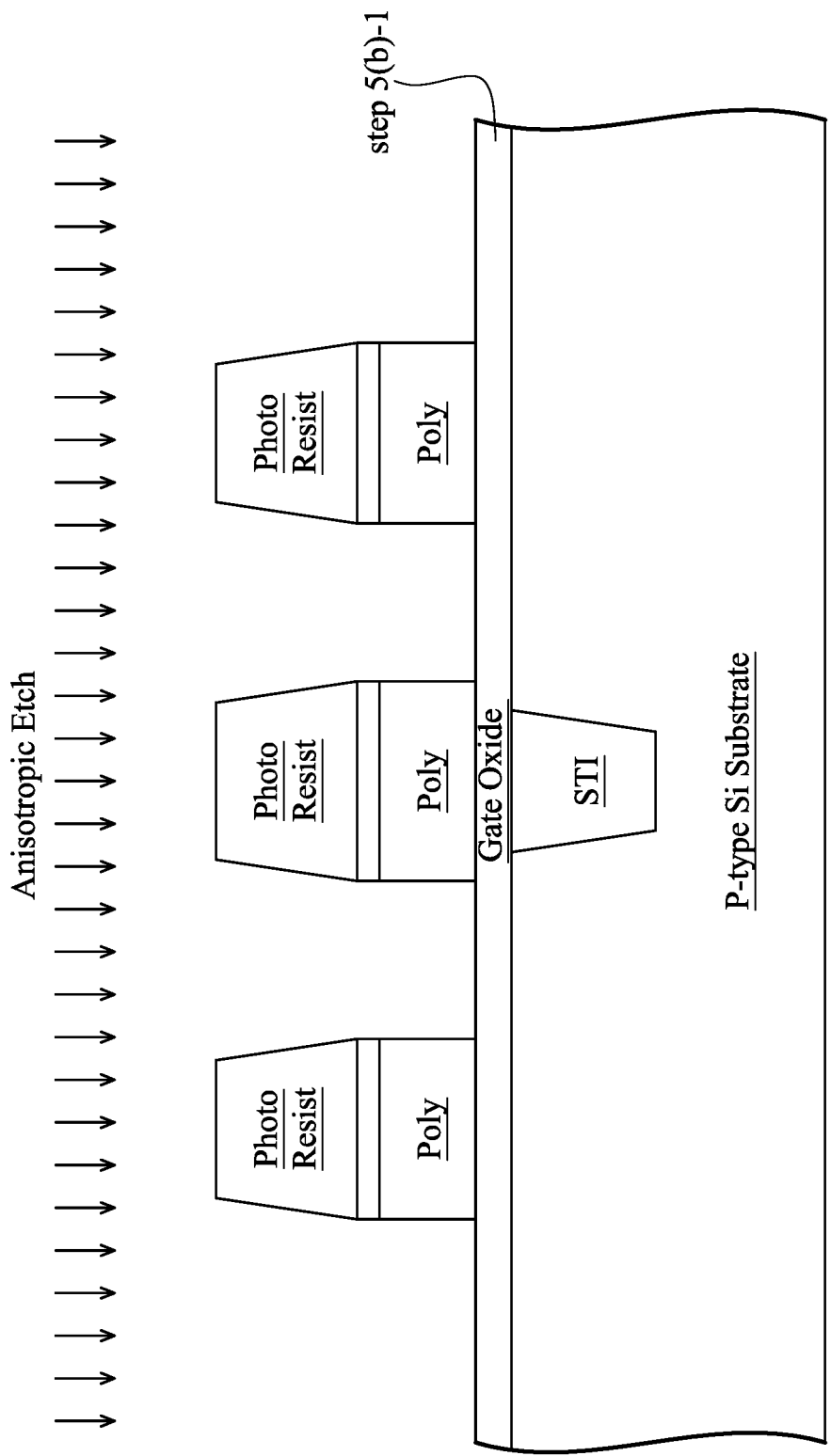
FIG. 5(b) is a cross-sectional view along AA' direction of a memory array in FIG. 2(b) corresponding to a step 5(b)-1 of a manufacturing process according to the second preferred embodiment of the present invention.

FIG. 5(b) shows a cross-sectional view along AA' direction of a memory array in FIG. 2(b) corresponding to a step 5(b)-1 of a manufacturing process according to the second preferred embodiment of the present invention. In the step 5(b)-1, it includes: (i) form a first photoresist pattern to define word line and ground poly line areas; (ii) use a first anisotropic etch to remove exposed nitride and conductive gate material.

Figure 6A:
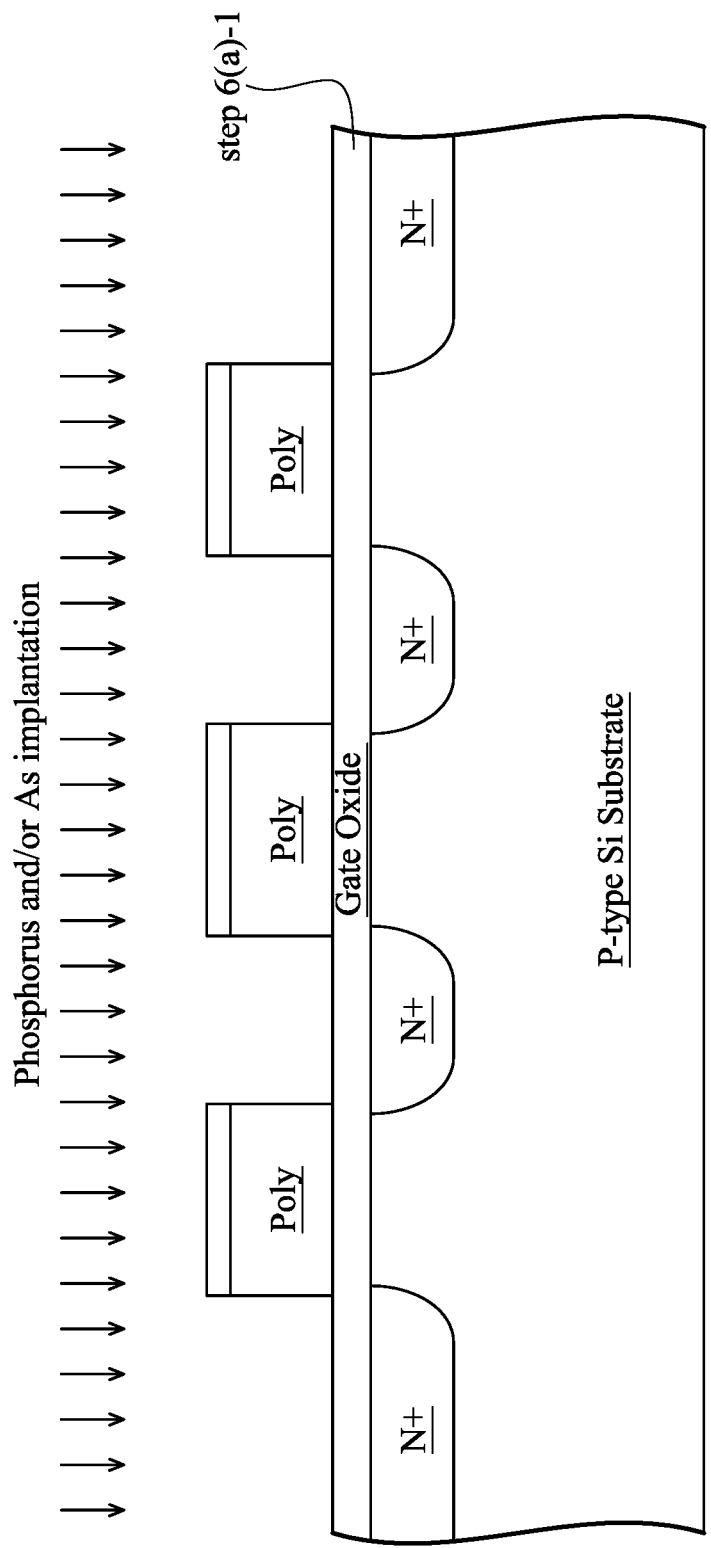
FIG. 6(a) is a cross-sectional view along AA' direction of a memory array in FIG. 2(a) corresponding to a step 6(a)-1 of a manufacturing process according to the first preferred embodiment of the present invention.

FIG. 6(a) shows a cross-sectional view along AA' direction of a memory array in FIG. 2(a) corresponding to a step 6(a)-1 of a manufacturing process according to the first preferred embodiment of the present invention. In the step 6(a)-1, it includes: (i) remove the first photoresist; (ii) form N+ source and drain areas (N+ source and drain areas can also be formed after gate dielectric thinning down), preferably to be with graded junction, such as by doubly diffused method (e.g. 30-40 KeV energy, 5E12-5E13/cm$^2$ dose Phosphorus & 15-30 KeV energy, 1-5E15/cm$^2$ dose As implants with RTA or furnace anneal), for higher junction breakdown voltage.

Figure 6B:
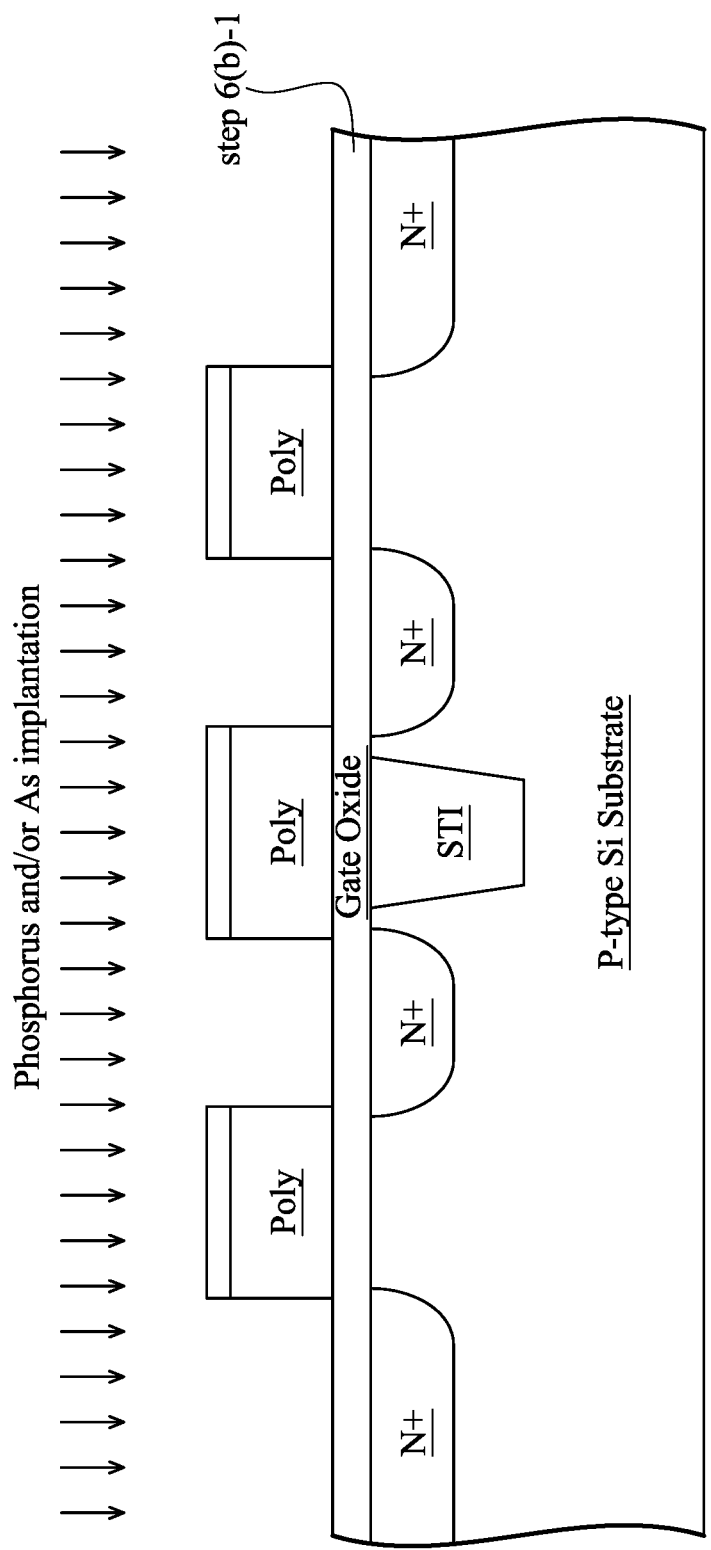
FIG. 6(b) is a cross-sectional view along AA' direction of a memory array in FIG. 2(b) corresponding to a step 6(b)-1 of a manufacturing process according to the second preferred embodiment of the present invention.

FIG. 6(b) shows a cross-sectional view along AA' direction of a memory array in FIG. 2(b) corresponding to a step 6(b)-1 of a manufacturing process according to the second preferred embodiment of the present invention. In the step 6(b)-1, it includes: (i) remove the first photoresist; (ii) form N+ source and drain areas (N+ source and drain areas can also be formed after gate dielectric thinning down), preferably to be with graded junction, such as by doubly diffused method (e.g. 30-40 KeV energy, 5E12-5E13/cm$^2$ dose Phosphorus & 15-30 KeV energy, 1-5E15/cm$^2$ dose As implants with RTA or furnace anneal), for higher junction breakdown voltage.

FIG. 7(a) shows a cross-sectional view along AA' direction of a memory array in FIG. 2(a) corresponding to a step 7(a)-1 of a manufacturing process according to the first preferred embodiment of the present invention. In the step 7(a)-1, it includes: (i) form a second photoresist pattern to expose ground-gate transistor areas; (ii) partially remove the exposed gate dielectric layer, preferably to be by a wet chemical, to thin down to 30-70% of the original thickness.

FIG. 7(b) shows a cross-sectional view along AA' direction of a memory array in FIG. 2(b) corresponding to a step 7(b)-1 of a manufacturing process according to the second preferred embodiment of the present invention. In the step 7(b)-1, it includes: (i) form a second photoresist pattern to expose ground-gate transistor areas; (ii) partially remove the exposed gate dielectric layer, preferably to be by a wet chemical, to thin down to 30-70% of the original thickness.

FIG. 8(a) shows a cross-sectional view along AA' direction of a memory array in FIG. 2(a) corresponding to a step 8(a)-1 of a manufacturing process according to the first preferred embodiment of the present invention. In the step 8(a)-1, it includes: (i) remove the second photoresist; (ii) form a 2nd layer of conductive material, such as N-doped poly silicon, silicide, metal, etc. (20-100 nm thick).

FIG. 8(b) is a cross-sectional view along AA' direction of a memory array in FIG. 2(b) corresponding to a step 8(b)-1 of a manufacturing process according to the second preferred embodiment of the present invention. In the step 8(b)-1, it includes: (i) remove the second photoresist; (ii) form a 2nd layer of conductive material, such as N-doped poly silicon, silicide, metal, etc. (20-100 nm thick).

FIG. 9(a) shows a cross-sectional view along AA' direction of a memory array in FIG. 2(a) corresponding to a step 9(a)-1 of a manufacturing process according to the first preferred embodiment of the present invention. In the step 9(a)-1, it includes: use a second anisotropic etch to remove 2nd conductive material on the horizontal surfaces, but leave Poly spacers on vertical sidewalls.

FIG. 9(b) shows a cross-sectional view along AA' direction of a memory array in FIG. 2(b) corresponding to a step 9(b)-1 of a manufacturing process according to the second preferred embodiment of the present invention. In the step 9(b)-1, it includes: use a second anisotropic etch to remove 2nd conductive material on the horizontal surfaces, but leave Poly spacers on vertical sidewalls.

FIG. 10(a) shows a cross-sectional view along AA' direction of a memory array in FIG. 2(a) corresponding to a step 10(a)-1 of a manufacturing process according to the first preferred embodiment of the present invention. In the step 10(a)-1, it includes: (i) remove cap nitride layer; (ii) form dielectric spacers 1123 (optional) around the Poly spacers 1122, self-aligned silicides (optional) on the gate areas and the substrate, an interlayer dielectric layer on the self-aligned silicides and the dielectric spacers, contact plugs on the two rows of outmost self-aligned silicides, and metal interconnects on the interlayer dielectric layer. As shown in FIG. 10(a), a ground-gate transistor 112 is electrically connected to the select transistor 111, and has a central conductive gate electrode region 1121 with two side Poly spacer regions 1122, two side dielectric spacer regions 1123 adjacent to the Poly spacer regions 1122, and a gate dielectric layer (Gate Oxide), wherein: a first and a second thicknesses of the gate dielectric layer underneath the two side Poly spacer regions 1122 (d1 and d2) are thinner than a third thickness of the gate dielectric layer underneath the central conductive gate electrode region 1121 (d3, where d1<d3 and d2<d3).

FIG. 10(b) shows a circuit diagram of 2 memory cells with a ground-gate transistor as shown in FIG. 10(a). In FIG. 10(b), the first unit cell 11 includes the first select transistor 111 and the ground-gate transistor 112, and the second unit cell 12 includes the ground-gate transistor 112 and the second select transistor 121.

FIG. 10(c) shows a cross-sectional view along AA' direction of a memory array in FIG. 2(b) corresponding to a step 10(c)-1 of a manufacturing process according to the second preferred embodiment of the present invention. In the step 10(c)-1, it includes: (i) remove cap nitride layer; (ii) form dielectric spacers (optional) around the Poly spacers, self-aligned silicides (optional) on the gate areas and the substrate, an interlayer dielectric layer on the self-aligned silicides and the dielectric spacers, contact plugs on the two rows of outmost self-aligned silicides, and metal interconnects on the interlayer dielectric layer. As shown in FIG. 10(c), a ground-gate transistor 211 is electrically connected to the first select transistor 111, and has a central conductive gate electrode region 2111 with 2 side Poly spacer regions 2112, two side dielectric spacer regions 2113 adjacent to the Poly spacer regions 2112, and a gate dielectric layer (Gate Oxide), wherein: a first and a second thicknesses of the gate dielectric layer underneath the two side Poly spacer regions 2112 (d1 and d2) are thinner than a third thickness of the gate dielectric layer underneath the central conductive gate elec-trode region 2111 (d3, where d1<d3 and d2<d3).

FIG. 10(d) shows a circuit diagram of 2 memory cells with a ground-gate transistor as shown in FIG. 10(c). As shown in FIG. 10(d), it includes the first unit cell 21 having the first select transistor 111 and the ground-gate transistor 211, and the second unit cell 22 having the ground-gate transistor 211 and the second select transistor 121.

FIG. 11(a) shows a cross-sectional view along AA' direction of a memory array in FIG. 2(a) corresponding to a step 11(a)-1 of a process to program state "1" to a select cell according to the first preferred embodiment of the present invention. In the step 11(a)-1, to program a select cell 111, it includes: (i) applying a voltage 3-10V to the selected bit line, and (ii) applying another voltage 3-10V to the selected WL to turn on the select transistor 111 in the selected memory cell. In this case, the selected bit line voltage is connected to the source from the drain of the select transistor 111. This results in 3-10V across the thin gate oxide between one side of the N+ region and the gate electrode of the ground-gate transistor 112, causing oxide rupture and forming a conductive path, where the second select transistor 121 is the unselected cell.

FIG. 11(b) shows a cross-sectional view along AA' direction of a memory array in FIG. 2(b) corresponding to a step 11(b)-1 of a process to program state "1" to a select cell according to the second preferred embodiment of the present invention. In the step 11(b)-1, to program a select cell 111, it includes: (i) applying a voltage 3-10V to the selected bit line, and (ii) applying another voltage 3-10V to the selected WL to turn on the select transistor 111 in the selected memory cell. In this case, the selected bit line voltage is connected to the source from the drain of the select transistor 111. This results in 3-10V across the thin gate oxide between one side of the N+ region and the gate electrode of the ground-gate transistor 211, causing oxide rupture and forming a conductive path, where the second select transistor 121 is the unselected cell.

To program a selected transistor in the proposed memory 1 or 2 (see FIGS. 2(a)-2(b)), the program bias conditions are shown in Table 1 as follows:

TABLE 1

| Program Bias Conditions | |
| --- | --- |
| Terminal | Bias Voltage |
| Selected WL | 3-10 V |
| Unselected WL | 0 V |
| Selected BL | 3-10 V |
| Unselected BL | 0 V or Floating |
| Substrate | 0 V |

To read a selected transistor in the proposed memory 1 or 2 (see FIGS. 2(a)-2(b)), the read bias conditions are shown in Table 2 as follows:

TABLE 2

| Read Bias Conditions | |
| --- | --- |
| Terminal | Bias Voltage |
| Selected WL | 1-3 V |
| Unselected WL | 0 V |
| Selected BL | 0.5-1.5 V |
| Unselected BL | 0 V or Floating |
| Substrate | 0 V |

Under the aforesaid read bias conditions, the selected OTP memory cell has a cell current flowing from the selected BL through the ruptured thin dielectric region to GND Poly Line, i.e. in "1" state, if the selected cell has been programmed prior to read. On the other hand, the cell current of the selected OTP cell flowing from the selected BL to GND Poly Line is blocked by the intact dielectric, i.e. in "0" state, if the selected cell has not been programmed.

According to the above-mentioned descriptions, the present invention discloses a 1.5-Transistor (1.5T) OTP memory with simpler layout and low oxide rupture programming current, which demonstrates the non-obviousness and novelty.

While the invention has been described in terms of what is presently considered to be the most practical and preferred embodiments, it is to be understood that the invention need not be limited to the disclosed embodiments. Therefore, it is intended to cover various modifications and similar configurations included within the spirit and scope of the appended claims, which are to be accorded with the broadest interpretation so as to encompass all such modifications and similar structures. For example, the present invention uses N-type transistors for illustration. The present invention can also use P-type transistors fabricated on an N-substrate or N-Well. In this case, all the source and drain regions are P+-type, and all the operation voltages for program and read are reversed to negative values.

What is claimed is:

1. A method of manufacturing a semiconductor device, comprising:
    (a) forming a gate dielectric layer on top of a substrate or a well;
    (b) forming a first conductive layer on the gate dielectric layer;
    (c) defining word line and ground poly line areas on the first conductive layer;
    (d) removing the first conductive layer exposed by a first photoresist pattern and forming gate areas;
    (e) forming source and drain areas under the gate dielectric layer and around the corresponding gate areas, wherein the gate areas within the ground poly line areas define ground-gate areas;
    (f) partially removing the gate dielectric layer around the ground-gate areas;
    (g) forming a second conductive layer; and
    (h) removing a portion of the second conductive layer so as to leave poly spacers around the corresponding gate areas.

2. The method according to claim 1, wherein the gate dielectric layer has a thickness of 2-20 nm, and the gate dielectric layer is made of a material being one selected from a group consisting of SiO2, SiON, HfO, and any combination thereof.

3. The method according to claim 1, wherein the step (c) is accomplished by forming the first photoresist pattern to define the word line and the ground line areas; the step (d) is accomplished by performing a first anisotropic etch; the step (d) further comprises a step (d1): removing the first photoresist pattern; the step (e) is performed by a doubly diffused method, for having a higher junction breakdown voltage; the step (f) further comprises a step (f0): forming a second photoresist pattern; and a step (f1): partially removing the gate dielectric layer exposed by the second photoresist pattern around the ground-gate areas; the step (g) further comprises a step (g0): removing the second photoresist pattern; the step (h) is accomplished by performing a second anisotropic etch; and the second conductive layer has a thickness of 20-100 nm.

4. The method according to claim 3, wherein the step (a) further comprises a step (a1): performing a 10-20 KeV energy, and 1E12-1E13/cm² dose B or BF2 ion implantation for a threshold voltage adjustment; and a step (a2): forming a cap nitride layer; the step (e) further comprises a step (e1): forming N+ source and drain areas under the gate dielectric layer and around the corresponding gate areas; the doubly diffused method in the step (e) provides a 30-40 KeV energy, 5E12-5E13/cm$^2$ dose Phosphorus implant or a 15-30 KeV energy, and 1-5E15/cm$^2$ dose As implant, both with an RTA or a furnace anneal; and the second conductive layer is made of a material being one selected from a group consisting of N-doped poly silicon, silicide, metal and any combination thereof.

5. The method according to claim 4, wherein the step (a) further comprises a step (a0): forming active regions by Shallow Trench Isolation (STI) process to form an STI structure on top of a P-type substrate or a P-type well.

6. The method according to claim 4, wherein the step (d) further comprises a step (d2) performing the first anisotropic etch to remove the cap nitride layer exposed by the first photoresist pattern; and a thickness of the cap nitride layer is 5-10 nm.

7. The method according to claim 3, wherein the step (a) further comprises a step (a1): performing an ion implantation for a threshold voltage adjustment; and a step (a2): forming a cap nitride layer; the step (e) further comprises a step (e1): forming P+ source and drain areas under the gate dielectric layer and around the corresponding gate areas; and the second conductive layer is made of a material being one selected from a group consisting of P-doped poly silicon, silicide, metal and any combination thereof.

8. The method according to claim 7, wherein the step (a) further comprises a step (a0): forming active regions by Shallow Trench Isolation (STI) process to form an STI structure on top of an N-type substrate or an N-type well.

9. The method according to claim 3, wherein the step (f) is performed by a wet chemical so as to remove 30-70% of an original thickness of the gate dielectric layer around the ground-gate areas.

10. The method according to claim 3, further comprising a step (i): forming dielectric spacers around the poly spacers, self-aligned silicides on the gate areas and the substrate, an interlayer dielectric layer on the self-aligned silicides and the dielectric spacers, contact plugs on the two rows of outmost self-aligned silicides, and metal interconnects on the interlayer dielectric layer.

11. A semiconductor device having at least a unit cell wherein the unit cell comprises:
    a select transistor; and
    half of a ground-gate transistor electrically connected to the select transistor, wherein the ground-gate transistor has a central conductive gate electrode region, two side conductive spacer regions and a gate dielectric layer, wherein:
    a first and a second thicknesses of the gate dielectric layer underneath the two side conductive spacer regions are thinner than a third thickness of the gate dielectric layer underneath the central conductive gate electrode region.

12. The semiconductor device according to claim 11, further comprising a first word line and a first bit line, wherein the select transistor has a first terminal connected to the first bit line, a control terminal connected to the first word line and a second terminal, the half of the ground-gate transistor has a first terminal connected to the second terminal of the select transistor and a control terminal connected to a ground, and when a first and a second voltages are applied to the first bit line and the first word line, a first oxide rupture occurs in the gate dielectric layer having the first thickness to form a first conductive path between the control and the first terminals of the half of the ground-gate transistor.

13. The semiconductor device according to claim 12 being a one-time programmable (OTP) memory, wherein the select transistor and the half of the ground-gate transistor are MOSFETs, each first terminal is a drain, the second terminal of the select transistor is a source, and each control terminal is a gate.

14. The semiconductor device according to claim 12, further comprising a substrate or a well, wherein the half of the ground-gate transistor further comprises a shallow trench isolation (STI) structure configured beneath the gate dielectric layer under the central conductive gate electrode region and above the substrate or the well.

15. The semiconductor device according to claim 14, wherein the substrate is a P-type substrate or an N-type substrate, and the well is a P-type well or an N-type well.

16. The semiconductor device according to claim 12, wherein the first voltage is higher than a breakdown voltage of the gate dielectric layer.

17. A method of programming and reading the semiconductor device according to claim 11, wherein the semiconductor device further comprises a first bit line, a first word line and a ground, the select transistor has a first terminal connected to the first bit line, a control terminal connected to the first word line, and a second terminal, the half of the ground-gate transistor has a first terminal connected to the second terminal of the select transistor and a control terminal connected to the ground, and the method comprises:
    applying a first voltage to the first bit line and a second voltage to the first word line to program the select transistor, wherein the first voltage causes a first oxide rupture in the gate dielectric layer having the first thickness to form a first conductive path between the control and the first terminals of the half of the ground-gate transistor; and
    applying a third voltage to the first bit line and a fourth voltage to the first word line to read the select transistor turned on by the first voltage and the second voltage step.

18. The method according to claim 17, wherein the first voltage is connected to the second terminal of the select transistor via the first terminal of the select transistor such that the first voltage is applied across the gate dielectric layer having the first thickness and the ground to cause the first oxide rupture and form the first conductive path connecting the first and the control terminals of the half of the ground-gate transistor.

19. The method according to claim 17, wherein the semiconductor device further comprises a substrate and bias conditions upon programming comprise:
    applying 3-10V to the first word line;
    applying 0V to each unselected word line;
    applying 3-10V to the first bit line;
    applying 0V to each unselected bit line, or floating each unselected bit line; and
    applying 0V to the substrate.

20. The method according to claim 17, wherein the semiconductor device further comprises a substrate and bias conditions upon reading comprise:
    applying 1-3V to the first word line;
    applying 0V to each unselected word line;
    applying 0.5-1.5V to the first bit line;
    applying 0V to each unselected bit line, or floating each unselected bit line; and
    applying 0V to the substrate.

* * * * *